(12) United States Patent
Ishida et al.

(10) Patent No.: US 8,196,070 B2
(45) Date of Patent: Jun. 5, 2012

(54) MASK FABRICATION SUPPORTING METHOD, MASK BLANK PROVIDING METHOD, AND MASK BLANK DEALING SYSTEM

(75) Inventors: Hiroyuki Ishida, Hokuto (JP); Tamiya Aiyama, Nirasaki (JP); Koichi Maruyama, Nirasaki (JP)

(73) Assignee: Hoya Corporation, Tokyo (JP)

( * ) Notice: Subject to any disclaimer, the term of this patent is extended or adjusted under 35 U.S.C. 154(b) by 122 days.

(21) Appl. No.: 12/685,218

(22) Filed: Jan. 11, 2010

(65) Prior Publication Data

US 2010/0178597 A1 Jul. 15, 2010

Related U.S. Application Data

(62) Division of application No. 10/592,320, filed as application No. PCT/JP2005/003901 on Mar. 7, 2005, now Pat. No. 7,660,456.

(60) Provisional application No. 60/551,057, filed on Mar. 9, 2004.

(51) Int. Cl.
*G06F 17/50* (2006.01)
*G03F 1/00* (2006.01)
*G06K 9/00* (2006.01)

(52) U.S. Cl. ............... 716/54; 430/5; 382/144; 382/145

(58) Field of Classification Search .............. 716/50–56; 430/5; 382/144, 145

See application file for complete search history.

(56) References Cited

U.S. PATENT DOCUMENTS

| | | | |
|---|---|---|---|
| 6,177,680 B1* | 1/2001 | Dick et al. | 250/492.22 |
| 7,175,952 B2 | 2/2007 | Omori | |
| 7,211,354 B2 | 5/2007 | Itoh | |
| 2002/0022184 A1* | 2/2002 | Tanaka et al. | 430/5 |
| 2002/0058186 A1 | 5/2002 | Nozawa et al. | |
| 2003/0077523 A1* | 4/2003 | Hata | 430/5 |
| 2003/0082460 A1* | 5/2003 | Stivers et al. | 430/5 |

FOREIGN PATENT DOCUMENTS

| | | |
|---|---|---|
| CN | 1441461 A | 9/2003 |
| EP | 1211558 A1 | 6/2002 |
| JP | 60-84542 A | 5/1985 |
| JP | 61-241659 A | 10/1986 |
| JP | 10-186635 A | 7/1998 |
| JP | 2001-33941 A | 2/2001 |
| JP | 2002-296197 A | 10/2002 |
| JP | 2003-149793 A | 5/2003 |
| JP | 2003-248299 A | 9/2003 |

OTHER PUBLICATIONS

German Office Action corresponding to German Patent Application No. 11 2005 000 548.8-51, dated Feb. 18, 2010.

* cited by examiner

*Primary Examiner* — Stacy Whitmore
(74) *Attorney, Agent, or Firm* — Sughrue Mion, PLLC

(57) ABSTRACT

A mask blank is provided by forming a plurality of films, including at least a thin film to be a transfer pattern, on a board. At the time of patterning a resist film of the mask blank according to pattern data, film information to check with a pattern is obtained for each of a plurality of the films.

10 Claims, 24 Drawing Sheets

[Fig. 2A]
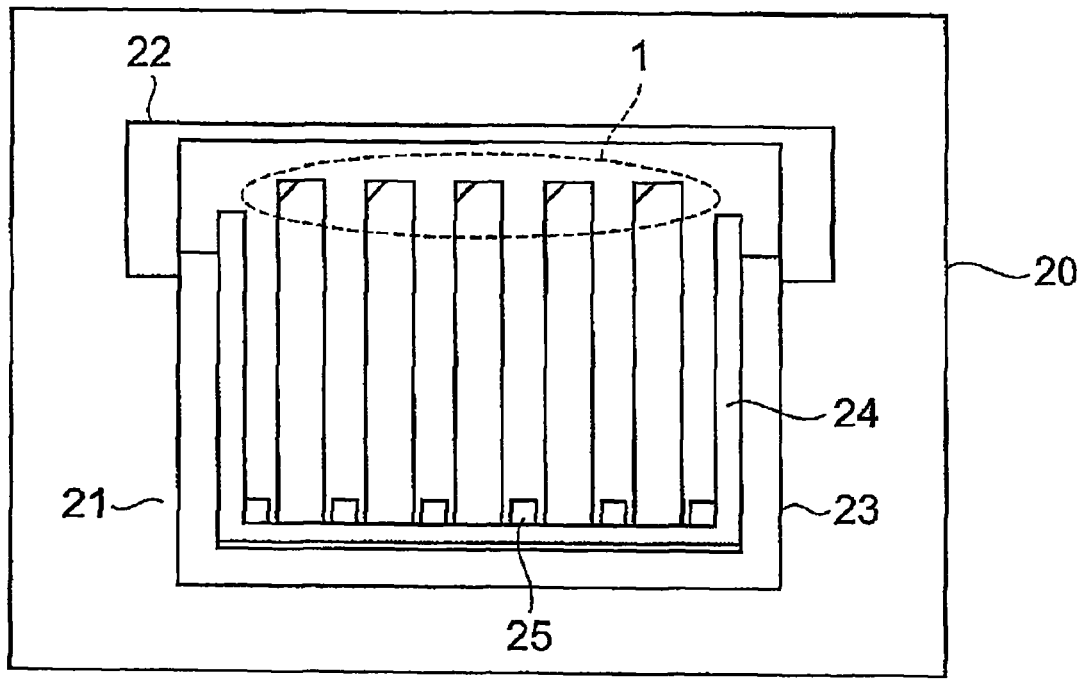
[Fig. 2B]
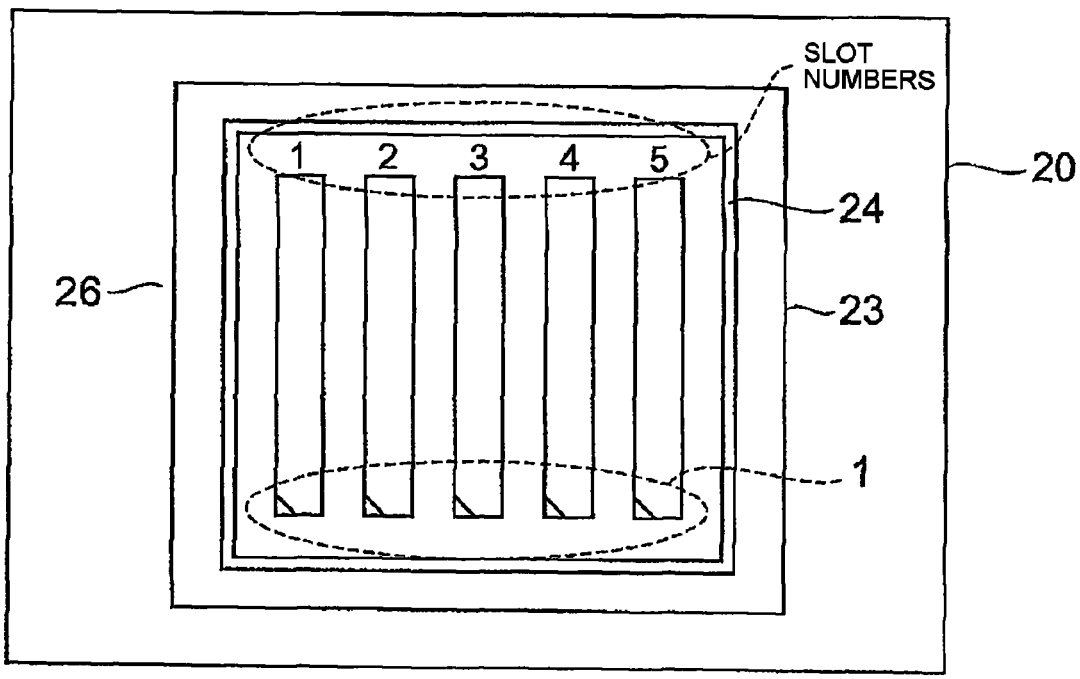

[Fig. 4]
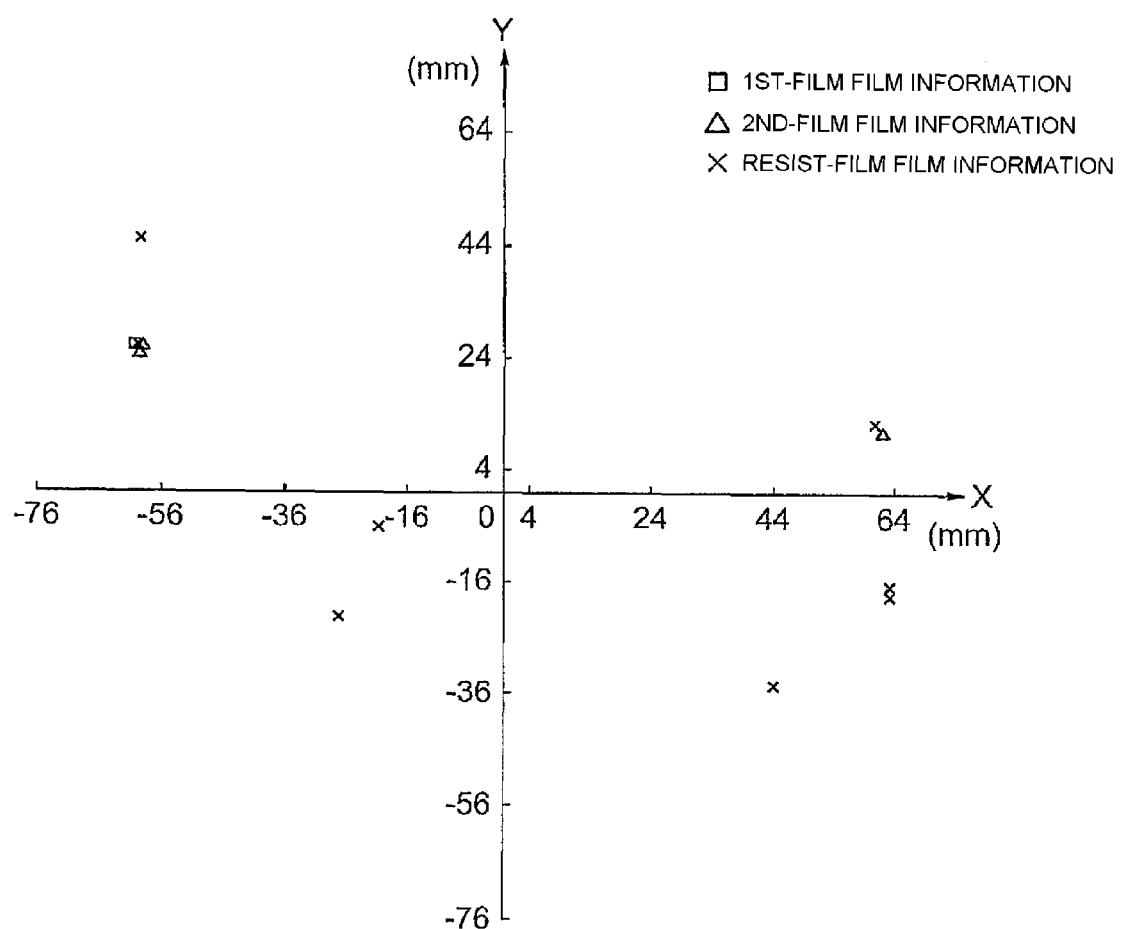

[Fig. 6]
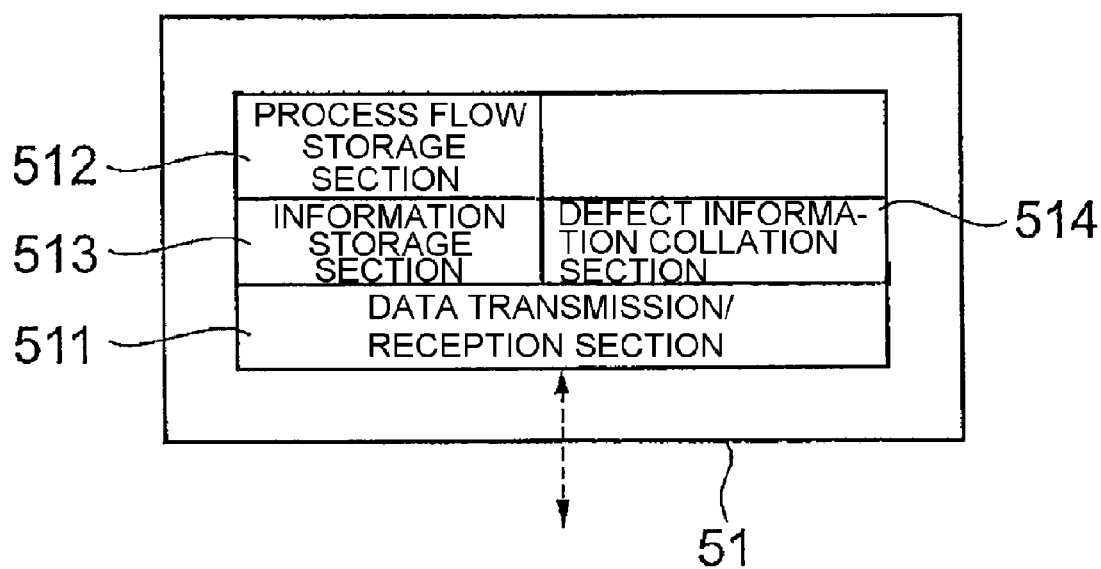
[Fig. 7]
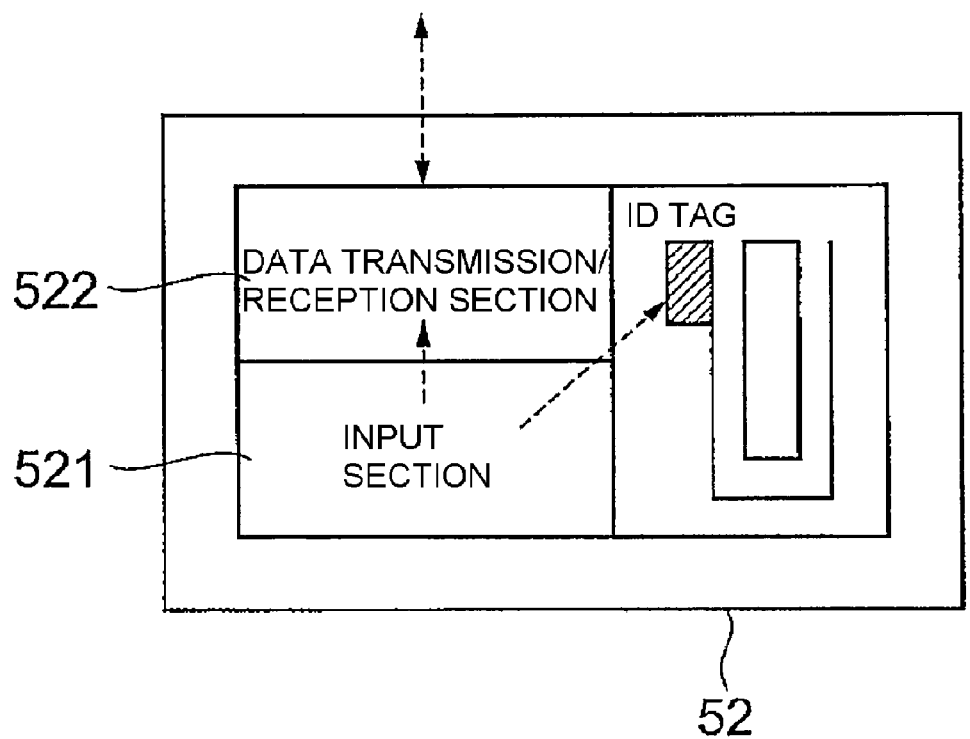

[Fig. 12]
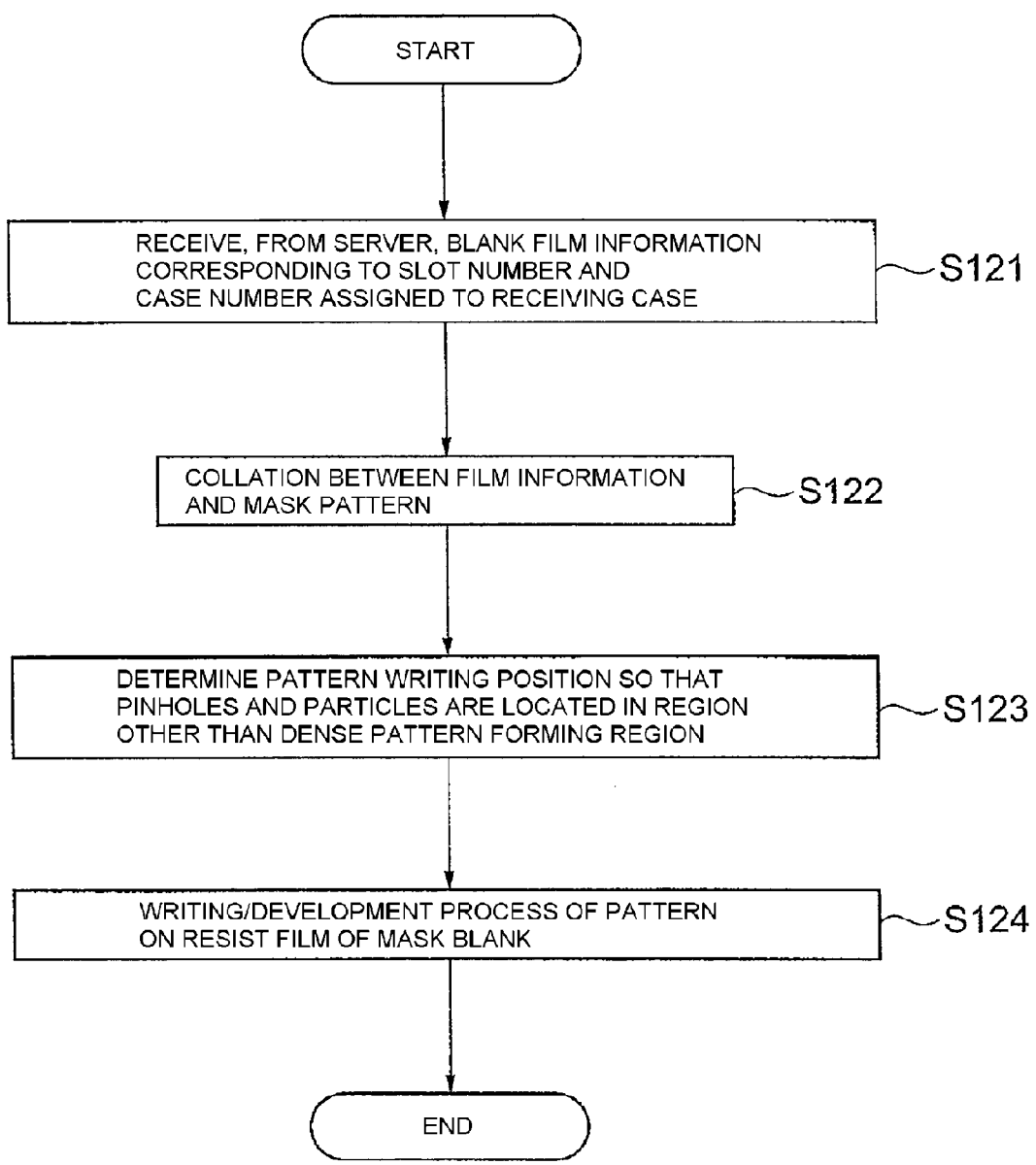

[Fig. 13A]
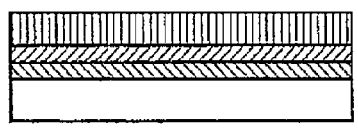
[Fig. 13B]
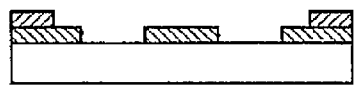
[Fig. 14]
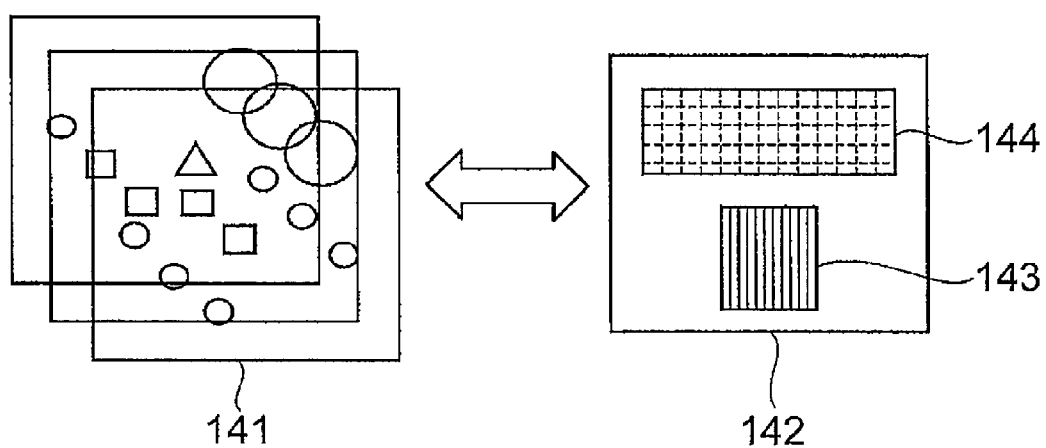

[Fig. 17]
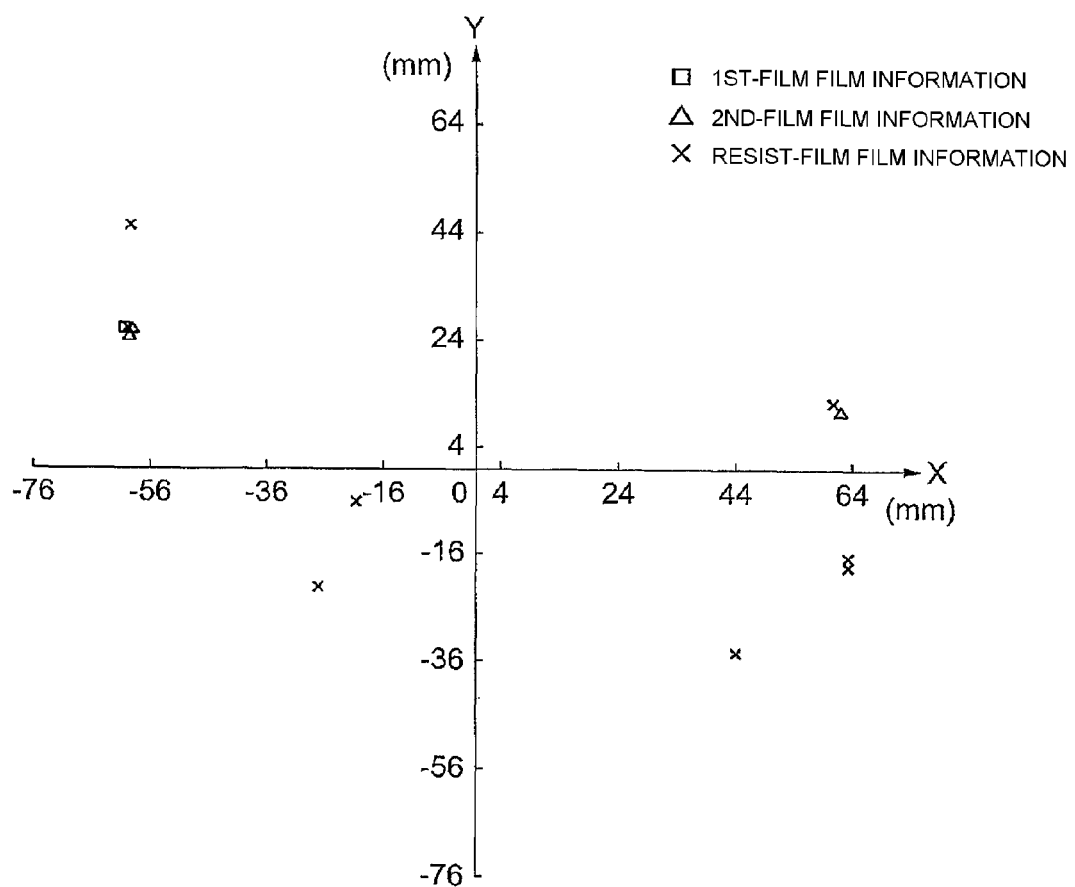

[Fig. 18A]
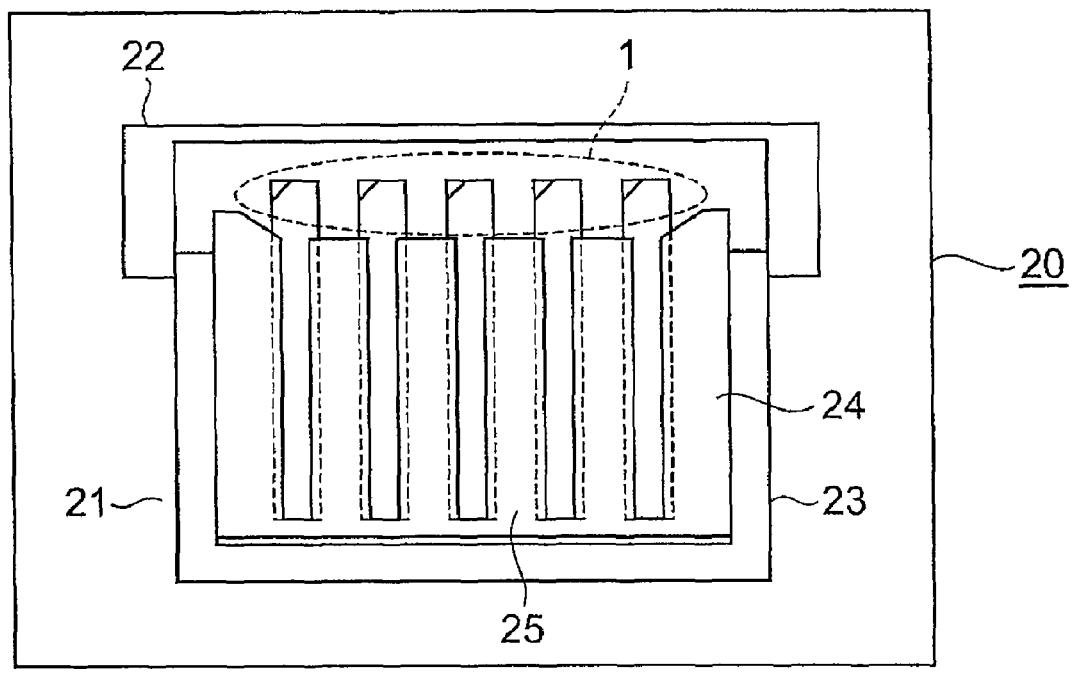
[Fig. 18B]
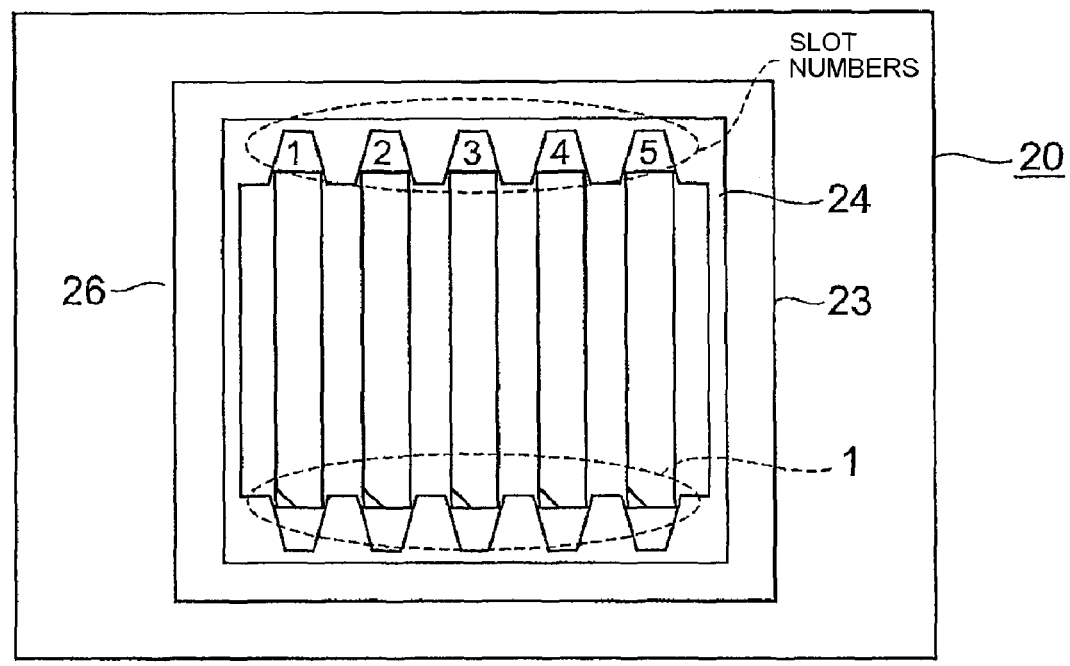

[Fig. 20]
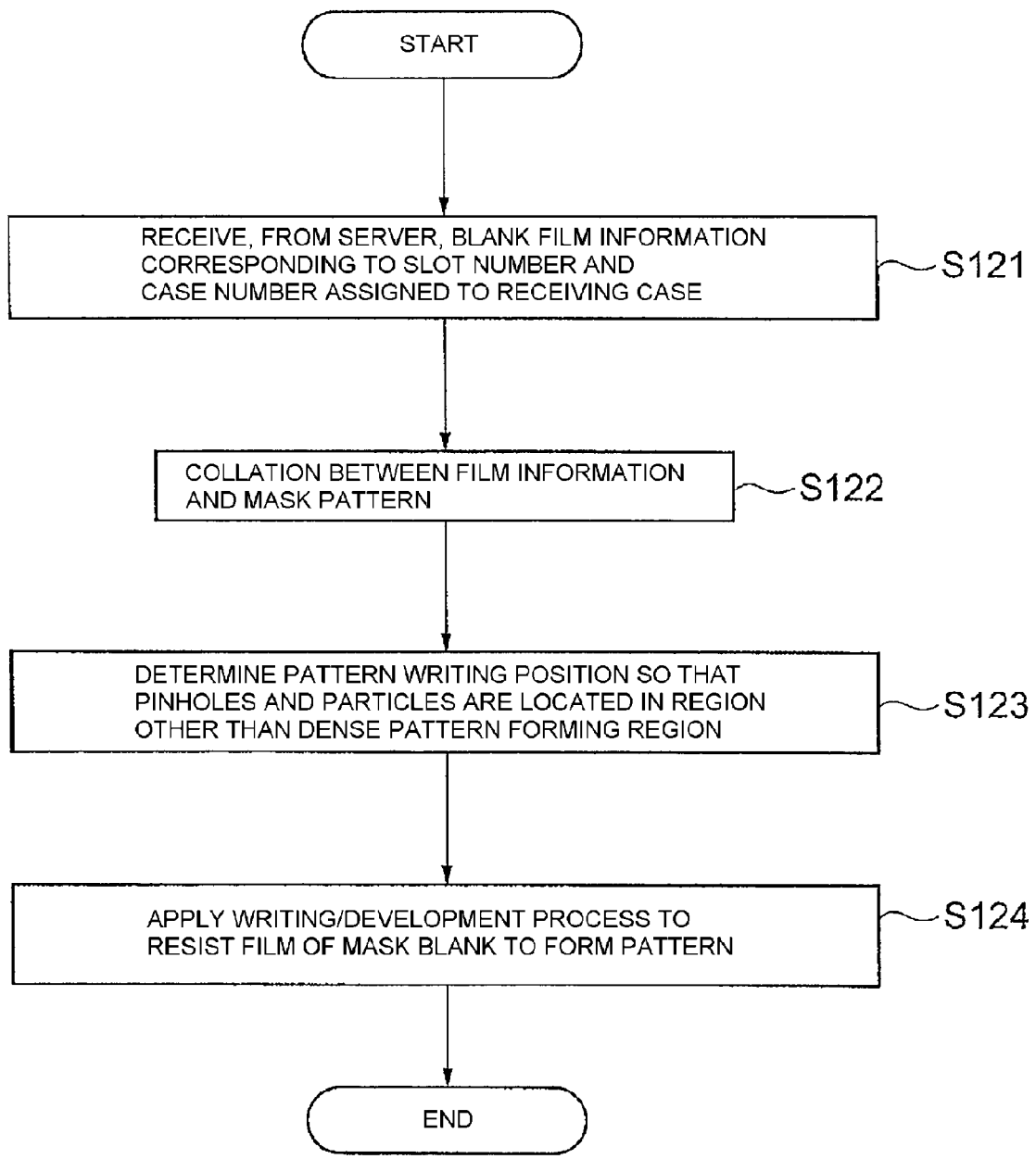

[Fig. 21A]
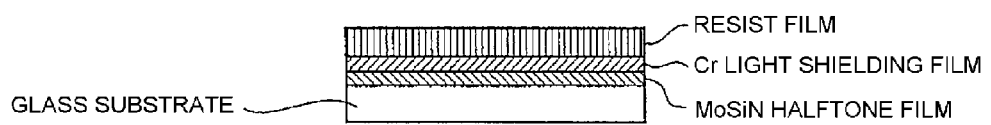
[FIG. 21B]
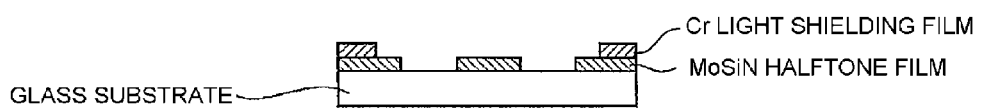
[Fig. 22]
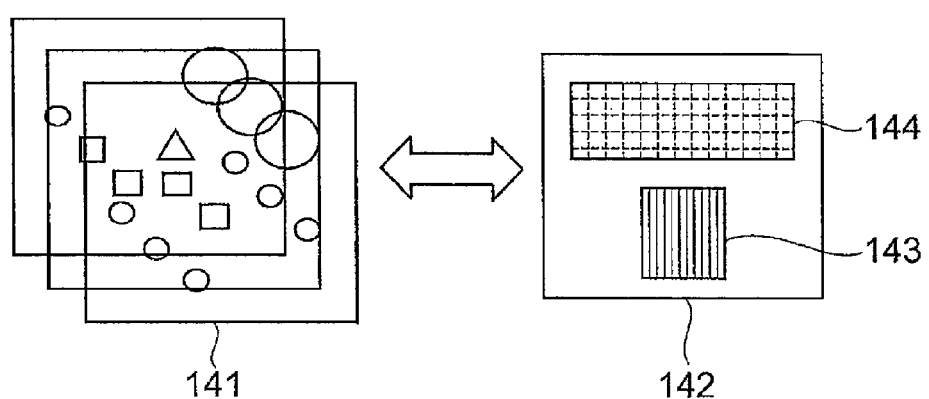

[Fig. 24]
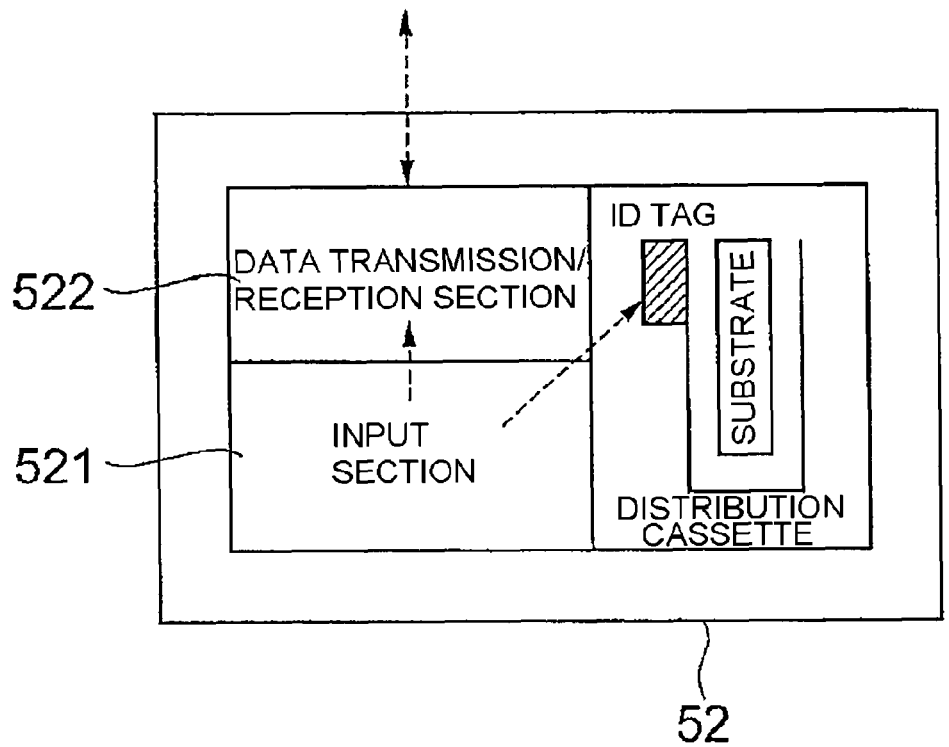
[Fig. 25]
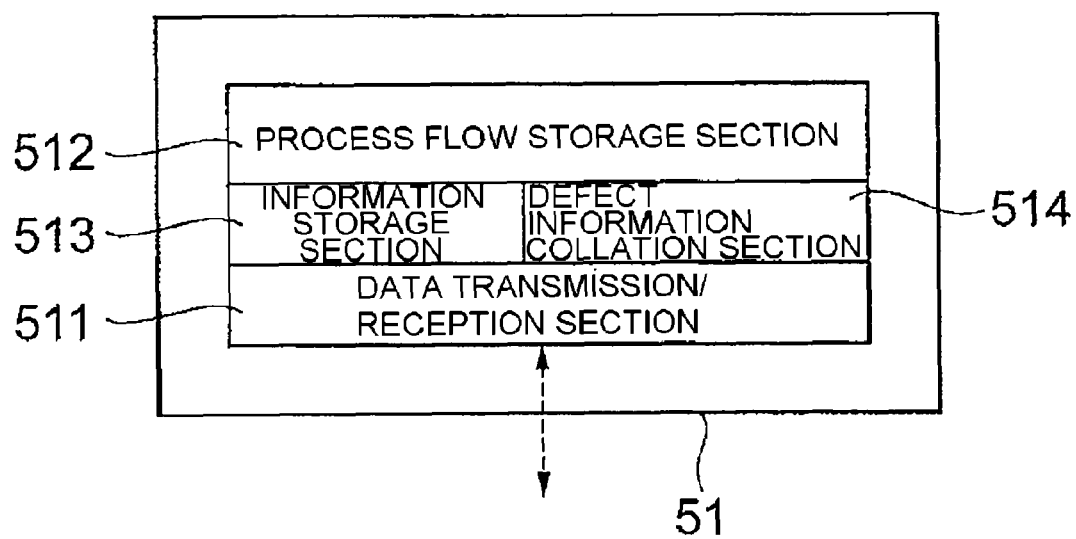

MASK FABRICATION SUPPORTING METHOD, MASK BLANK PROVIDING METHOD, AND MASK BLANK DEALING SYSTEM

This is a divisional of application Ser. No. 10/592,320 filed Sep. 11, 2006, now U.S. Pat. No. 7,660,456, which is a 371 of PCT/JP05/03901 file Mar. 7, 2005, which claims benefit of Provisional Application No. 60/551,057 filed Mar. 9, 2004. The entire disclosure(s) of the prior application(s), application Ser. No. 10/592,320 is hereby incorporated by reference.

TECHNICAL FIELD

This invention relates to a mask blank for semiconductor manufacture and, in particular, relates to acquisition and management of mask blank quality information and the manufacture of a mask blank and a mask.

BACKGROUND ART

As a conventional technique relevant to this invention, Japanese Unexamined Patent Application Publication (JP-A) No. 2003-149793 is cited. According to the technique described in this publication, it is described that a blank maker classifies blanks by defect ranks according to inspection results and supplies the blanks to a mask maker while attaching defect information.

On the other hand, Japanese Unexamined Patent Application Publication (JP-A) No. 2003-248299 discloses a technique for accurately locating a defect position on a photomask substrate.

In these conventional techniques, although the defect information provided along with the mask blank shows the relative position relationship between defects existing on the mask blank surface, there is provided no reference for correspondence between the mask blank and the position information of the defect information. Therefore, even if there is the defect information, it is not possible to accurately locate where the defects exist on the actual mask blank and, hence, pattern failure occurs in the writing/development process. Further, there is no definite guarantee in terms of providing agreement between a direction of the mask blank placed in a receiving case and a direction of the defect information. Therefore, the actual mask blank and the defect information are deviated by 90 degrees, 180 degrees, or 270 degrees so that the pattern failure occurs in the writing/development process. This is because, in the manufacturing process, after taking out a substrate placed in a container such as a distribution case, a cassette, or a receiving case and applying predetermined treatment thereto, when placing it again in another container, there is no means for confirming that the direction of the placed substrate is the same in the former container and the latter container.

Conventionally, there has been no particular disadvantage with such defect information in fabrication of masks by a mask maker. This is because, in the case of a conventional exposure light source such as i-line (wavelength 365 nm) or KrF (wavelength 248 nm), the allowable defect levels, i.e. the allowable ranges of the size and number of defects, are not so narrow.

However, following higher integration of semiconductor devices, patterns are complicated and the line widths thereof are narrowed. In order to cope with it, the wavelengths of exposure light sources are shortened and ArF (wavelength 193 nm), F2 (157 nm), and so on are examined as light sources, and as a result, it is expected that the allowable defect levels for masks will be stricter than before.

Further, because of the complication and miniaturization of patterns, the time and cost required for manufacturing a mask by writing a pattern with a writing apparatus have been rapidly increasing. Therefore, the need has been increasing for suppressing pattern defects caused by mask blanks. As such pattern defects, there are, for example, defects called particles and pinholes.

On the other hand, as mask blanks adapted for the miniaturization of patterns, the demand for phase shift mask blanks has been increasing. In a halftone phase shift mask blank being one type of the phase shift mask blanks, there are formed a halftone film, a light shielding film, and further a resist film if necessary. The halftone film has a light shielding function and a phase shift function and thus has a role different from that of the light shielding film.

In order to achieve improvement in yield of the mask manufacturing process, simplification of the process, cost reduction, and so on, it is necessary to obtain defect information of each of the films forming the mask blank.

Patent Document 1:

Japanese Unexamined Patent Application Publication (JP-A) No. 2003-149793

Patent Document 2:

Japanese Unexamined Patent Application Publication (JP-A) No. 2003-248299

DISCLOSURE OF THE INVENTION

Problem to be Solved by the Invention

However, according to the conventional techniques, there is no need for acquiring defect information of each of the films and only the results of inspection of the mask blank in the final shipping form are provided as described above. Therefore, a blank maker does not manage defect information per substrate in the mask blank manufacturing process and thus cannot provide defect information of each of films forming a mask blank to a mask maker.

Consequently, the mask maker cannot suppress occurrence of pattern failure in the writing/development process caused by defects of mask blanks. Further, although the pattern failure is normally corrected in a pattern correction process by the use of a FIB (focused ion beam), a laser, or the like, since the pattern complication/miniaturization has advanced, the case has appeared where the correction is disabled. In such a case, a mask should be manufactured again from the beginning.

This invention has been made under these circumstances and has an object to provide a mask fabrication supporting method that can suppress pattern failure caused by a mask blank when a mask is fabricated from the mask blank. Another object is to provide a mask blank providing method and a mask blank manufacturing method where film information is added so as to enable suppression of pattern failure due to a mask blank when a mask is fabricated from the mask blank. Further, another object is to provide a transfer mask manufacturing method that can improve the manufacturing yield and suppress the manufacturing cost by collating a pattern, to be formed, with film information.

Means for Solving the Problem

For accomplishing the foregoing objects, this invention provides the following techniques.

(1) To provide a mask fabrication supporting method of providing film information of a plurality of films forming a mask blank to a mask maker and suppressing pattern formation failure when fabricating a transfer mask from the mask blank by patterning the film, a mask blank providing method, a mask blank manufacturing method, and a method of manufacturing a transfer mask by the use of the mask blank.

Specifically, in the mask blank manufacturing process, a management number is assigned to a substrate and film information of a plurality of films are collated based on the management number, or film information of a plurality of films are collated based on surface form information (convex portion or concave portion) formed at the same position in the respective film information of the plurality of films, so that position information between the plurality of film information is guaranteed to thereby prevent pattern failure in the mask fabrication.

Another aspect of this invention is as follows.

In the mask blank manufacturing process, identification of individuals is carried out by utilizing means such as assigning management numbers to respective substrates or mask blanks offered for production.

Then, a plurality of films are stacked in order on the substrate and film information about the films is acquired.

The film information is state information of a film including surface information of the film, surface form information, for example, a convex shape, a concave shape, or their combination on the film surface, optical property information, or the like and is information correlated with position information of the film surface. The optical properties referred to herein include transmittance, reflectance, absorptivity, phase difference, and so on.

The film information acquired about the plurality of respective films stacked on the substrate can be individual-identified based on the management number or the like so that the information is mutually collated. Therefore, the relationship between the mask blank individual and the acquired plurality of film information is guaranteed and the relationship between the plurality of film information can be guaranteed, and further, the position in the mask blank indicated by position information included in the plurality of film information is guaranteed.

Substrate information about the substrate may be acquired herein.

The substrate information is state information of a substrate including surface information of the substrate, surface form information, for example, a convex shape, a concave shape, or their combination on the substrate surface, optical property information, or the like and is information correlated with position information of the substrate surface. The optical properties referred to herein include transmittance, reflectance, absorptivity, phase difference, and so on.

By forming a film on the substrate and acquiring substrate information about the substrate and film information about the film, since the substrate information and the film information can be individual-identified based on the management number or the like and collated with each other, the relationship between the mask blank individual and the acquired substrate information and film information is guaranteed and the relationship between the substrate information and the film information can be guaranteed, and further, the position in the mask blank indicated by position information included in the substrate information or the film information is guaranteed.

The management number is not necessarily assigned to the substrate. Since the surface form of a film is formed according to the surface form of a film being an underlayer of the subject film or according to the surface form of the substrate, by collating form information included in the plurality of film information or form information included in the film information and the substrate information, the relationship between the mask blank individual and the acquired film information or substrate information can be guaranteed, the relationship between the plurality of film information or the relationship between the film information and the substrate information can be guaranteed, the relationship between position information included in the plurality of film information and the position in the mask blank is guaranteed, and the relationship between the position information included in the substrate information or the film information and the position in the mask blank is guaranteed.

In this invention, with respect to a mask blank individual comprising a substrate and films formed on the substrate, mask blank information composed of substrate information and film information, or of a plurality of film information is acquired. Further, position information included in the mask blank information guarantees the position in the mask blank. That is, the mask blank information in this invention is characterized by being three-dimensional information of the mask blank and being acquired so as to be recognizable as internal information of the mask blank, i.e. mask blank in-body information.

Since the information not only about the surface of the mask blank, but also about the inside of the mask blank body can be grasped in advance, it is possible to prevent fabrication of a defective transfer mask in the mask fabrication.

This invention includes a structure in which a reference point of position of the position information included in the mask blank information and a reference point of position of the mask blank are correlated with each other to thereby acquire information. Further, it includes a structure in which a reference point of position of the position information included in the substrate information and a reference point of position of the substrate are correlated with each other to thereby acquire information. Further, it includes a structure in which a reference point of position of the position information included in the film information and a reference point of position of the substrate or the film are correlated with each other to thereby acquire information.

(2) To provide a mask fabrication supporting method of providing surface information of a mask blank including surface form information and position information to a mask maker and correlating this surface information and the surface form of a mask blank by respectively provided reference points, thereby allowing a mask fabricator to specify a region of pattern formation, a mask blank providing method, a mask blank manufacturing method, and a method of manufacturing a transfer mask by the use of the mask blank.

Specifically, when placing a mask blank in a receiving case which is used in the processes of the mask blank manufacture or for providing mask blanks to a mask maker, the directivity of a substrate is managed (aligned in a certain specific direction) according to a reference mark provided on the substrate or over the substrate so that surface information including surface form information and position information in the mask blank and the position of the surface form of the mask blank can be made correspond to each other, thereby preventing pattern failure in the mask fabrication.

Herein, the film information is information obtained by variously inspecting a film immediately after formation thereof on the substrate. The film information includes surface form information indicating the position, size, type, and so on of a defect on a film and composition distribution information indicating a composition distribution in the film surface including the position and range where a film material partially changes in composition, the state after the change in composition, and so on. Surface information including surface form information of an uppermost film serving as the surface after the completion of a mask blank is called mask blank surface information.

Another aspect of this invention is as follows.

To provide a mask fabrication supporting method of providing the mask blank information to a mask maker such that the mask blank information and the mask blank individual relating to this information can be correlated with each other, thereby allowing a mask fabricator to select a region where a predetermined mask pattern is to be formed on the mask blank, a mask blank information providing method, a mask blank providing method, a mask blank manufacturing method, and a method of manufacturing a transfer mask by the use of the mask blank.

This invention includes a structure in which a reference point of position of position information included in the mask blank information and a reference point of position of the mask blank are correlated with each other.

This invention includes a structure in which the arrangement and directivity of substrates or mask blanks are managed when placing the substrates or the mask blanks in a receiving tool which is used in the mask blank manufacturing processes and/or for providing mask blanks to a mask maker. For example, it includes a mode in which a plurality of substrates or a plurality of mask blanks are placed while being aligned in a certain direction. In this event, the placement may be carried out while referring to reference points provided on the substrates, films, or mask blanks.

For example, the mask blank manufacturing processes include a process of preparing a substrate, a process of acquiring substrate information (e.g. substrate inspection process), a process of forming a film on the substrate, a process of acquiring film information (e.g. film inspection process), a process of placing a mask blank in a receiving tool in order to provide the mask blank to a mask maker, and so on and, in the substrate or mask blank placement operation carried out in these processes, the mode is included in which a plurality of substrates or a plurality of mask blanks are placed while being aligned in the certain predetermined direction in order to manage the directivity of the substrates or the mask blanks.

The receiving tool referred to herein includes, for example, a later-described holder or case. As the reference point referred to herein, use can be made of, for example, an identifiable mark.

As the mark or the reference mark for use in this invention, use can be made of, for example, a mark, called a notch mark, given to a substrate or a mark, called a film mark, given to a film, which will be described later.

When the mask blanks are provided while being placed in the foregoing manner, since the mask blanks are provided while being aligned in the predetermined arrangement and the predetermined directivity, a mask fabricator can identify the mask blank individuals and comprehend the position reference points of the mask banks by referring to or without referring to the reference points.

According to this invention, through the position reference point of the mask blank, the surface information and the internal information of the mask blank for fabricating a transfer mask therefrom can be grasped based on the provided mask blank information and, hence, the mask fabricator can select a region where a predetermined mask pattern is to be formed. That is, since the mask fabricator can comprehend the presence of a surface defect or an internal defect that will cause pattern failure or impede a certain function of a transfer mask before forming a predetermined mask pattern, it is possible to improve the manufacturing yield to thereby achieve production of transfer masks with high profit rate or production of low-priced transfer masks.

The present invention is preferably used for a mask blank or a transfer mask formed with a phase shift film, for example, a halftone film. For example, a halftone phase shift mask being one type of phase shift masks is formed with a halftone film and a light shielding film on an optically transparent substrate. The halftone film has both a light shielding function of substantially shielding exposure light and a phase shift function of shifting the phase of the exposure light and thus has a function of controlling the transmittance and the phase difference to thereby highlight the pattern edge of a pattern transferred to a transfer target. The halftone phase shift mask is formed with the pattern of the halftone film on the optically transparent substrate and comprises a light transmitting portion formed with no halftone film pattern and adapted to transmit light with an intensity that substantially contributes to the exposure and a light semitransmitting portion formed with the halftone film pattern and adapted to transmit light with an intensity that does not substantially contribute to the exposure. Further, the phase of the light having transmitted the light semitransmitting portion is in a substantially inverse relationship to the phase of the light having transmitted the light transmitting portion. Therefore, the lights having passed through the vicinity of a boundary portion between the light semitransmitting portion and the light transmitting portion and mutually diffracted into the others' regions through the diffraction phenomenon serve to cancel each other to make substantially zero the light intensity at the boundary portion, thereby improving the contrast at the boundary portion. Accordingly, the quality required for the mask blank formed with the halftone film is higher as compared with a mask blank formed only with a mere light shielding film and, further, when applying a patterning process to the mask blank to fabricate a transfer mask, it is difficult to reduce the percent defective.

This invention provides the following techniques.

To provide a mask fabrication supporting method of providing, to a mask maker, film information for specifying a region to be subjected to pattern formation in order to suppress pattern formation failure when fabricating a transfer mask from a mask blank, formed on a substrate with a plurality of films including at least a thin film which is to be a transfer pattern, by patterning the thin film, the mask fabrication supporting method characterized in that the film information is information obtained from the plurality of films forming the mask blank.

The pattern may have a dense pattern forming region where a relatively dense pattern is formed and a sparse pattern forming region where a relatively sparse pattern is formed.

The film information may include any of the type of a convex portion or a concave portion that will cause a pattern defect, the size of the convex portion or the concave portion, and position information of the convex portion or the concave portion.

The position information may be produced on the basis of a notch mark formed on the substrate and/or a film mark by the thin film formed at the peripheral portion on the main surface of the substrate.

Part or all of the mask blank information, the substrate information, and the film information may be provided by the use of a communication line.

The films may include a phase shift film having a phase shift function with respect to exposure light.

Further, this invention provides a mask blank providing method of providing the foregoing mask fabrication supporting method along with the mask blank to a mask maker, the mask blank providing method characterized in that the mask blank is provided while being placed in a receiving case and held by a holder having a holding slot formed for holding the mask blank and the mask blank information is identified by mask blank specifying means indirectly assigned to the mask blank.

The mask blank information may be identified by a slot number assigned to the slot of the holder.

Further, this invention provides a mask blank manufacturing method comprising a process of preparing a substrate for a mask blank, a thin film forming process of forming a thin film, which is to be a transfer pattern, on the substrate, a thin film information acquisition process of acquiring film information of the thin film, a thin film information recording process of recording and storing in an information storage medium the film information of the thin film acquired in the thin film information acquisition process, a resist film forming process of forming a resist film on the thin film, a resist film information acquisition process of acquiring film information of the resist film, a resist film information recording process of recording and storing in an information storage medium the film information of the resist film acquired in the resist film information acquisition process, and a film information collation process of collating the film information of the thin film and the film information of the resist film.

Herein, after the process of preparing the substrate for the mask blank, there may be included a substrate information acquisition process of acquiring substrate information of the substrate. Further, there may be included a substrate information recording process of recording and storing in an information storage medium the substrate information acquired in the substrate information acquisition process. Further, there may be included a collation process of collating the substrate information and the film information.

After preparing the substrate for the mask blank, there may be provided a management number assigning process of assigning a management number to the substrate for the mask blank, and the film information of the thin film and the film information of the resist film may be collated based on the assigned management number. Further, the substrate information and the film information may be collated.

The substrate information or the film information may include any of the type of a convex portion or a concave portion, the size of the convex portion or the concave portion, and position information of the convex portion or the concave portion.

The position information may be produced on the basis of a notch mark formed on the substrate and/or a film mark by the thin film formed at the peripheral portion on the main surface of the substrate.

The substrate information, the film information of the thin film, and the film information of the resist film may be collated based on specific forms, for example, convex portions or concave portions, included in the substrate information, the film information of the thin film, and the film information of the resist film and formed at the same position.

Further, this invention provides a transfer mask manufacturing method of using a mask blank formed on a substrate with a film including at least a thin film which is to be a transfer pattern and patterning the thin film according to pattern data to be formed, thereby fabricating a transfer mask, the transfer mask manufacturing method characterized by collating the mask blank information acquired by the foregoing mask fabrication supporting method and the pattern data and, in order to suppress pattern formation failure, specifying a region to be subjected to pattern formation in the mask blank.

The pattern may have a dense pattern forming region where a relatively dense pattern is formed and a sparse pattern forming region where a relatively sparse pattern is formed.

The next invention is also included in this invention. That is, there is provided a mask fabrication supporting method of providing, to a mask fabricator, mask blank information necessary for specifying a region to be subjected to pattern formation in order to suppress pattern formation failure when fabricating a transfer mask from a mask blank, formed on a substrate with a film including at least a thin film which is to be a transfer pattern, by patterning the thin film, the mask fabrication supporting method characterized in that the mask blank information includes surface form information, a reference point of position of the surface form in the mask blank provided to the mask fabricator and a reference point of position information corresponding to the surface form information correspond to each other, and the mask fabricator reflects the mask blank information on the mask blank through the reference points to comprehend the state of the mask blank, thereby specifying the region to be subjected to the pattern formation.

A reference mark may be provided on the substrate or over the substrate and the reference point of the position information may be produced so as to have a certain fixed relationship to the reference mark and may correspond to the reference point of position of the surface form in the mask blank.

A reference mark may be provided on the substrate, the film, or the mask blank and, when acquiring substrate information or film information, the information may be produced such that a reference point of position information included in the information has a fixed relationship to the reference mark, thereby making the reference point of position of the mask blank information and the reference point of position of the provided mask blank correspond to each other.

It is preferable that the reference mark be provided so as to be capable of specifying the orientation or the direction of the substrate or the mask blank.

The reference mark is preferably provided at a portion adjacent to a corner of the substrate or the mask blank. In the case of providing reference marks at portions in even number, by arranging that one of the reference marks is not provided at a rotation-symmetric position of the other mark when seeing the substrate or the mask blank in a plan view, the direction or the directivity of the substrate or the mask blank can be easily specified, which is thus preferable.

The reference mark may have a shape that can specify the directivity of the substrate.

The reference marks may be provided at asymmetric positions with respect to a line parallel to a side of the substrate and passing through the center of the substrate.

The reference mark may be a notch mark formed on the substrate and/or a film mark by the thin film formed on the main surface of the substrate.

The substrate information or the film information may be information acquired in a specific direction on the basis of the reference mark.

There may be provided a film forming process of forming on the substrate the film including the thin film which is to be the transfer pattern and a surface information acquisition process of acquiring surface information of the film and, in the film forming process and the surface information acquisition process, the directivity of the substrate or the mask blank may be managed on the basis of the reference mark.

In the respective processes for manufacturing the mask blank, when placing the substrate or the mask blank in a case for use in transferring the substrate or the mask blank to each process, the directivity of the substrate or the mask blank may be managed on the basis of the reference mark.

In the manner as described above, the directivity of the substrate or the mask blank is managed as predetermined. That is, if a plurality of substrates or mask blanks are arranged with their directions aligned and, further, also when acquiring information, if a plurality of substrates or mask blanks are aligned in the fixed direction to thereby acquire the information, it is preferable for this invention.

The surface information may include at least one of the surface information of the substrate and the surface information of the film.

The surface information of the film may include surface information of a phase shift film.

The surface form may include surface roughness or waviness, a convex portion and/or a concave portion, foreign matter or a hollow, or film fall-off which may cause pattern formation failure when fabricating a transfer mask from the mask blank by patterning the thin film, and further, may include a particle-shaped defect and/or a pinhole-shaped defect caused by a defect inspection apparatus.

The surface information may include information about the height, wavelength, and period of the roughness or waviness, the height and size of the convex portion, the depth and size of the concave portion, the height and size of the foreign matter, the depth and size of the hollow, the height and size of the particle, or the depth and size of the pinhole.

The pattern may have a dense pattern forming region where a relatively dense pattern is formed and a sparse pattern forming region where a relatively sparse pattern is formed.

The sparse pattern forming region may be a monitor chip forming region formed for testing electrical properties.

The transfer mask may be a system LSI manufacturing transfer mask.

A plurality of mask blanks and mask blank information corresponding to the respective mask blanks may be provided to a mask fabricator.

Further, this invention provides a mask blank dealing system for carrying out the foregoing mask fabrication supporting method, the mask blank dealing system characterized by directly or indirectly assigning, to a plurality of mask blanks to be delivered to a mask maker, management numbers or management symbols adapted to specify the respective mask blanks, wherein mask blank information is provided to the mask maker along with the mask blanks while being correlated with the management numbers or the management symbols.

The management numbers or the management symbols may be slot numbers and a case number assigned to a holder formed with slots for holding the mask blanks and a receiving case receiving the holder therein.

The mask blank information may be provided to the mask maker by the use of a communication line.

The mask blank information may be stored in information storage means (server) while being correlated with the management numbers or the management symbols and the mask maker may access the information storage means (server) by the use of the communication line to obtain the mask blank information based on the management numbers or the management symbols.

Further, this invention provides a mask blank manufacturing method comprising a process of preparing a substrate for a mask blank, a film forming process of forming a film including a thin film, which is to be a transfer pattern, on the main surface of the substrate, a surface information acquisition process of acquiring surface information of the mask blank necessary for specifying a region to be subjected to pattern formation in order to suppress pattern formation failure when fabricating a transfer mask by patterning the thin film, and a surface information storing process of recording and storing the surface information in an information storage medium, the mask blank manufacturing method characterized by providing a reference mark on the substrate or over the substrate and acquiring the surface information in a specific direction on the basis of the reference mark.

The reference mark may have a shape that can specify the directivity of the substrate.

The reference marks may be provided at asymmetric positions with respect to a line parallel to a side of the substrate and passing through the center of the substrate.

The reference mark may be a notch mark formed on the substrate and/or a film mark by the thin film formed on the main surface of the substrate.

In the respective processes for manufacturing the mask blank, when placing the substrate in a case for use in transferring the substrate to each process, the directivity of the substrate may be managed on the basis of the reference mark.

After preparing the substrate for the mask blank, there may be provided a management number assigning process of directly or indirectly assigning a management number, adapted to specify the substrate, to the substrate for the mask blank, and the surface information of the manufactured mask blank may be collated based on the assigned management number.

Further, there may be provided a packaging process of placing the mask blank in a receiving case and packaging it, wherein the mask blank may be placed while being held by a holder formed with a slot adapted to hold the mask blank placed in the receiving case and being directly or indirectly assigned mask blank specifying means for identifying the mask blank and the surface information.

The mask blank specifying means may be a slot number and a case number assigned to the holder and the receiving case.

Further, this invention provides a transfer mask manufacturing method of using a mask blank formed on a substrate with a film including at least a thin film which is to be a transfer pattern and patterning the thin film according to pattern data to be formed, thereby fabricating a transfer mask, the transfer mask manufacturing method characterized by collating surface information of the mask blank correlated with the position of the surface form in the mask blank and acquired by the foregoing mask fabrication supporting method and the pattern data and, in order to suppress pattern formation failure, specifying a region to be subjected to pattern formation in the mask blank.

The pattern data has a dense pattern forming region where a relatively dense pattern is formed and a sparse pattern forming region where a relatively sparse pattern is formed. When the surface information includes a surface form that will cause pattern failure, the surface information and the pattern data may be collated to specify the arrangement of the pattern data with respect to the mask blank so that the surface form that will cause the pattern failure is located outside the dense pattern forming region.

Further, this invention provides a transfer mask manufacturing method of using a mask blank formed on a substrate with a film including at least a thin film which is to be a transfer pattern and patterning the thin film according to pattern data to be formed, thereby fabricating a transfer mask, the transfer mask manufacturing method characterized by, before applying the patterning process to the mask blank, collating mask blank information relating to the mask blank acquired by the mask fabrication supporting method of this invention and the pattern data and, in order to suppress pattern formation failure and/or in order to prevent impediment of a function of the transfer mask, selecting a region in the mask blank where the pattern is to be formed.

The pattern data includes a region having a relatively dense pattern and a region having a relatively sparse pattern. When the mask blank information includes state information, i.e. form information, optical property information, or the like, that will cause pattern failure or that will cause impediment of the function of the transfer mask, it is possible to select a position other than a position where such a state is present and locate the region where the relatively dense pattern is formed.

Further, this invention provides a transfer mask fabrication supporting method for supporting a transfer mask fabricator, which uses a mask blank formed on a substrate with a film including at least a thin film that is to be a transfer pattern and patterns the thin film according to pattern data to be formed, thereby fabricating a transfer mask, wherein, before applying the patterning process to the mask blank, mask blank information relating to the mask blank acquired in advance by this invention and the pattern data are collated and a region in the mask blank where the pattern is to be formed is selected so as to suppress pattern formation failure and/or prevent impediment of a function of the transfer mask.

Further, this invention provides a transfer mask fabrication supporting method for supporting a transfer mask fabricator, which uses a mask blank formed on a substrate with a film including at least a thin film that is to be a transfer pattern and patterns the thin film according to pattern data to be formed, thereby fabricating a transfer mask, wherein, before applying the patterning process to the mask blank, mask blank information relating to the mask blank acquired in advance by this invention and the pattern data are collated and a specific mask blank is selected so as to suppress pattern formation failure and/or prevent impediment of a function of the transfer mask.

The sparse pattern forming region may be a monitor chip forming region formed for testing electrical properties.

The transfer mask may be a system LSI manufacturing transfer mask.

Further, this invention may be a mask blank providing method of providing the foregoing mask fabrication supporting method along with the mask blank to a mask maker, wherein the mask blank may be placed in a receiving case, and the directivity of the mask blank placed in the receiving case and the directivity of the substrate in the surface information acquisition process of acquiring the surface information may be correlated by a reference mark.

In the respective processes for manufacturing the mask blank, when placing the substrate in a case for use in transferring the substrate to each process, the directivity of the substrate may be managed on the basis of the reference mark.

The mask blank information acquisition method of this invention can also be said as follows.

That is, this invention provides a mask blank information acquisition method for acquiring mask blank information being information relating to a mask blank having a plurality of films stacked on a surface of a substrate, the method characterized in that the mask blank information includes substrate information and one or more film information or two or more film information, the substrate information includes position information in a plane coordinate system (two-dimensional coordinate system) corresponding to the surface of the substrate and state information indicating a state of the substrate correlated with the position information, the film information each includes position information in a plane coordinate system corresponding to the corresponding one of the films and state information indicating a state of the film correlated with the position information, and the plane coordinate system of the substrate information or the film information included in the mask blank information has a predetermined correlation.

For example, it may be carried out so as to include a step of forming a first film on the surface of the substrate or on another film formed on the surface of the substrate, a step of acquiring first film information relating to a state of the first film formed, a step of forming a second film on the first film, a step of acquiring second film information relating to the second film formed, and a step of producing mask blank information including the first film information and the second film information.

Alternatively, there may be included a step of preparing the substrate, a step of acquiring substrate information relating to a state of the substrate prepared, a step of forming a film on the surface of the substrate, a step of acquiring film information relating to a state of the film formed, and a step of producing mask blank information including the substrate information and the film information.

Reference points of the plane coordinate systems included in the substrate information and the film information may have a predetermined relationship to each other or may be determined on the basis of at least one of a mark formed at the substrate and a mark formed at the film.

There may be further included a step of collating the substrate information and/or the film information with each other.

The state information may include at least one of surface form information and optical property information.

At least one of the films may be a phase shift film adapted to shift a phase of exposure light.

The mask blank information may include information produced by projecting the film information of the plurality of films onto a plane.

In order to assign, to the substrate, information indicating the direction of the substrate, various techniques are considered. For example, there may be further included a step of providing a detectable reference mark as state information at a predetermined position on the substrate and/or the film before acquiring the film information, wherein the mask blank information may include information indicating a direction of the substrate determined on the basis of the reference mark. The reference mark may have a shape that can specify a direction. The profile of the substrate may have a shape having rotation symmetry, while, the shape of the substrate including the reference mark provided has rotation asymmetry. The typical profile of the substrate is rectangle including square and oblong.

When providing the reference mark, there may be included a step of forming a film a on the substrate by an apparatus A and measuring the film a to acquire film information a including the reference mark, a step of removing the substrate from the apparatus A, a step of placing the substrate in a case while aligning the substrate in a predetermined direction on the basis of the reference mark, a step of transferring the case to an apparatus B, a step of setting the substrate in the apparatus B while aligning the substrate in a predetermined direction on the basis of the reference mark, and a step of forming a film b on the substrate by the apparatus B and measuring the film b to acquire film information b including the reference mark.

When providing the reference mark, there may be included a step of setting the substrate in a measuring apparatus to measure the substrate, thereby acquiring the substrate information including the reference mark, a step of removing the substrate from the measuring apparatus, a step of placing the substrate in a case while aligning the substrate in a predetermined direction on the basis of the reference mark, a step of transferring the case to an apparatus A, a step of setting the substrate in the apparatus A while aligning the substrate in a predetermined direction on the basis of the reference mark, and a step of forming a film a on the substrate by the apparatus A and measuring the film a to acquire film information a including the reference mark.

The mask blank individual may be identified by referring to the acquired mask blank information.

The state information may include at least two kinds of measurement values.

At least one of the substrate information and the film information may include position information in a three-dimensional coordinate system further including coordinates in a thickness direction of the substrate or the film.

Further, this invention provides a mask blank information providing method for providing mask blank information being information relating to a mask blank fabricated by stacking a plurality of films on a substrate, the method characterized by providing the mask blank information acquired by the foregoing mask blank information acquisition method, along with the mask blank.

Further, this invention provides a transfer mask fabrication supporting method for supporting fabrication of a transfer mask by providing mask blank information to a mask maker, the method characterized by comprising a step of providing the mask blank information to the mask maker by the foregoing mask blank information providing method, wherein, in order to prevent fabrication of a defective transfer mask, the mask blank information provided is referred to for specifying a region on the corresponding mask blank where a mask pattern is to be formed, before forming the mask pattern on the mask blank.

Further, this invention provides a transfer mask fabrication supporting method for supporting fabrication of a transfer mask by providing mask blank information to a mask maker, the method characterized by comprising a step of providing the mask blank information to the mask maker by the foregoing mask blank information providing method, wherein a reference point of a coordinate system in the mask blank information is notified to the mask maker through the reference mark, and the mask maker provided with the mask blank information acquires the correlation between the plane coordinate systems through the reference mark and determines a region, where a mask pattern is to be formed, based on the acquired correlation and the mask blank information.

In this transfer mask fabrication supporting method, the mask pattern formed on the mask blank may include a relatively dense pattern block and a relatively sparse pattern block.

Further, this invention provides a transfer mask manufacturing method for manufacturing a transfer mask by forming a mask pattern, which is to be a transfer pattern, on a mask blank, the method characterized by determining a region where the mask pattern is to be arranged on the mask blank, based on the mask blank information acquired by the foregoing mask blank information acquisition method.

Further, this invention provides a mask blank manufacturing method for manufacturing a mask blank, the method characterized by including the foregoing mask blank information acquisition method.

Further, this invention provides a mask blank information acquisition system for acquiring mask blank information being information relating to a mask blank having a plurality of films stacked on a surface of a substrate, the system characterized by comprising at least two information acquisition means among means for acquiring substrate information relating to a state of the substrate, means for acquiring first film information relating to a state of a first film formed on the surface of the substrate or on another film formed on the surface of the substrate, and means for acquiring second film information relating to a state of a second film being a film other than the first film formed on the surface of the substrate, and further comprising means for producing mask blank information including the information acquired by the information acquisition means.

In this mask blank information acquisition system, the substrate information may include position information in a plane coordinate system corresponding to the surface of the substrate and state information indicating a state of the substrate correlated with the position information, the film information may include position information in a plane coordinate system corresponding to the film and state information indicating a state of the film correlated with the position information, and the plane coordinate system of the substrate information or the film information included in the mask blank information may have a predetermined correlation.

In the foregoing mask blank information acquisition method, the substrate may have a polygonal shape and the reference mark may be provided in a region sandwiched between mutually contacting two sides of the substrate.

In the foregoing mask blank information acquisition method, the even number of reference marks may be provided at mutually rotation asymmetric positions.

Further, this invention provides a transfer mask fabrication supporting method for supporting fabrication of a transfer mask by providing mask blank information to a mask maker, the method characterized by comprising a step of providing mask blank information of a plurality of mask blanks to the mask maker by the foregoing mask blank information providing method, wherein the mask blank information provided is referred to for selecting one of the plurality of mask blanks before forming a mask pattern.

In the foregoing mask blank information acquisition method, there may be further included, after the step of acquiring the film information b, a step of placing the substrate in a case while aligning the substrate in a predetermined direction on the basis of the reference mark.

In the foregoing mask blank information acquisition method, there may be further included, after the step of acquiring the film information a, a step of placing the substrate in a case while aligning the substrate in a predetermined direction on the basis of the reference mark.

This invention provides a mask blank providing method for providing a mask blank, the method characterized by providing, along with a mask blank, mask blank information relating to the mask blank acquired by the foregoing mask blank information acquisition method.

Effect of the Invention

Through the manufacture of a mask blank, the directions of substrate information and film information and the direction of an actual substrate can be made consistent with each other.

Further, even if the substrate is handled in a wrong direction during the manufacture, the direction error can be detected by comparing the substrate information/film information with each other.

Based on the acquired substrate information/film information, the mask blank can be individually identified. That is, the substrate information/film information can be used as a kind of identifier.

By providing the substrate information and the film information corresponding to the direction of the substrate, it is possible to accurately transmit the positions of defects existing in the respective substrate and film layers of the mask blank.

Since the defects of the respective layers of the mask blank can be accurately transmitted, it becomes possible to fabricate a mask while avoiding defect portions, so that pattern failure of the mask can be prevented.

Further, even if there exists a portion having defects, depending on the kind/size/number etc. thereof and the shape/density etc. of a pattern to be written, it is possible to judge in advance that writing of the pattern causes no problem and, hence, the effective utilization of mask blanks can be achieved.

BRIEF DESCRIPTION OF THE DRAWINGS

FIG. 2A is a sectional view for explaining a mask blank receiving case 10.

FIG. 2B is a plan view for explaining the mask blank receiving case 10.

FIG. 4 is a graph for explaining one example of mask blank film information (surface information) acquired by a mask blank film information (surface information) acquisition process of this invention.

FIG. 6 is a block diagram for explaining a host computer 51.

FIG. 7 is a block diagram for explaining a cassette number/slot number assigner 52.

FIG. 12 is a flowchart for explaining a pattern writing/development process in the mask manufacturing process in an orderer/mask factory 12.

FIG. 13A is a sectional view of a mask blank before being subjected to the writing/development process in the mask manufacturing process.

FIG. 13B is a sectional view of a transfer mask fabricated through the mask manufacturing process.

FIG. 14 is a diagram for explaining the arrangement of a sparse pattern forming region and a dense pattern forming region carried out based on blank film information and mask pattern data.

FIG. 17 is a graph for explaining one example of mask blank film information (surface information) acquired by a mask blank film information (surface information) acquisition process of this invention.

FIG. 18A is a sectional view for explaining a receiving case 10 for receiving mask blanks therein.

FIG. 18B is a plan view for explaining the receiving case 10 for receiving mask blanks therein.

FIG. 20 is a flowchart for explaining a mask manufacturing process including a process in which a mask factory 112 applies a writing/development process to a resist film of a mask blank by the use of blank film information, thereby forming a pattern.

FIG. 21A is a sectional view of the mask blank before carrying out the writing/development process in the mask manufacturing process.

FIG. 21B is a sectional view of a transfer mask fabricated through the mask manufacturing process.

FIG. 22 is a diagram for explaining the arrangement of a sparse pattern forming region and a dense pattern forming region carried out based on blank film information and mask pattern data.

FIG. 24 is a block diagram for explaining a cassette number/slot number assigner 52.

FIG. 25 is a block diagram for explaining a host computer 51.

Figure 1:
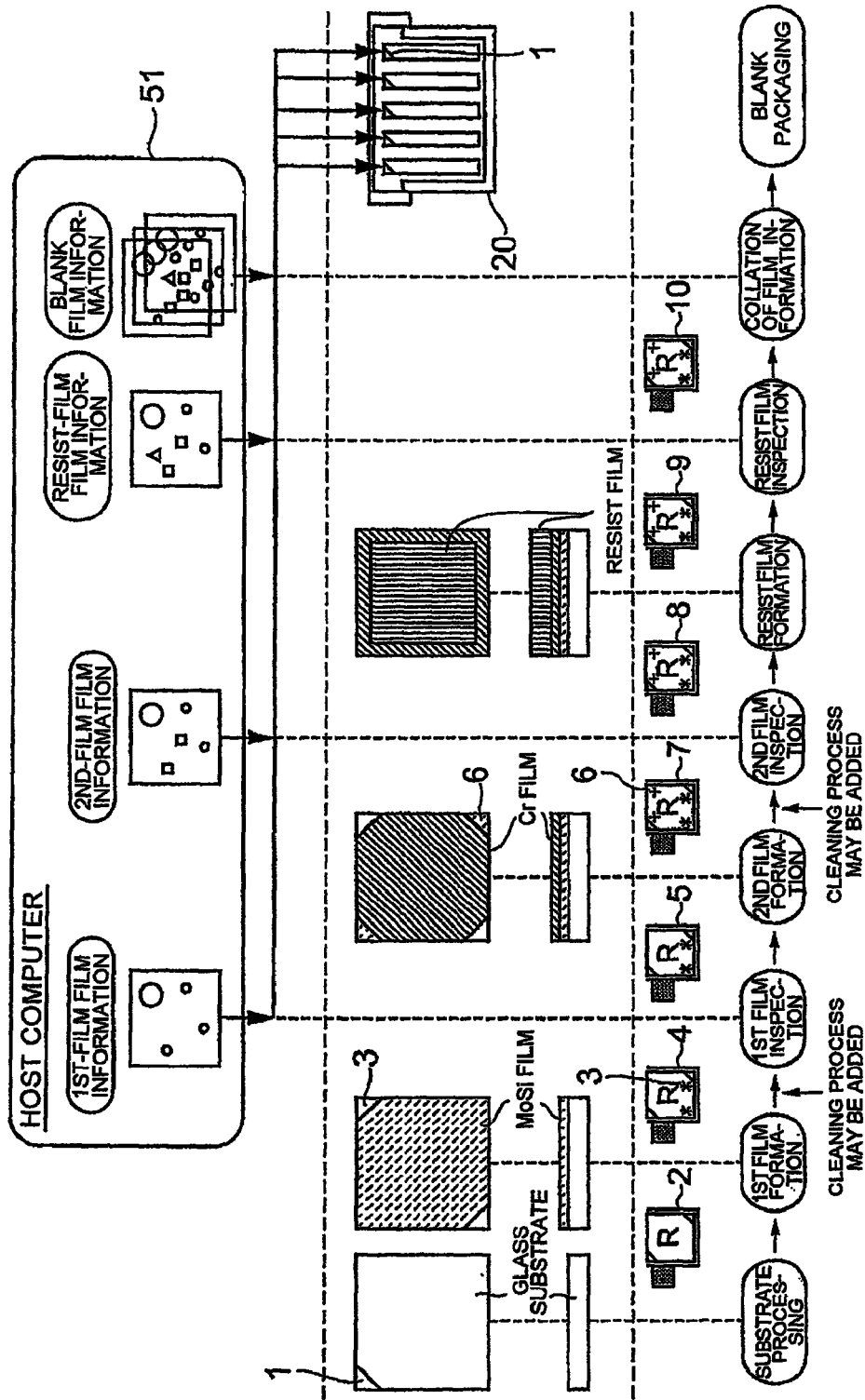
FIG. 1 is a flowchart for explaining a mask blank film information acquisition method of this invention.

DESCRIPTION OF SYMBOLS 1 notch mark
2 distribution case
2', 4', 5', 7', 8', 9', 10' ID tag
3, 6, 31 film mark
4, 5, 7, 8, 9, 10 distribution case
20 receiving case
21 case number
22 lid
23 outer box
24 inner box
25 slot
26 front indication
50 mask blank production line control system
51 host computer
52 cassette number/slot number assigner
53 first film forming apparatus
54 first film defect inspection apparatus
55 second film forming apparatus
56 second film defect inspection apparatus
57 resist film forming apparatus 58 resist film defect inspection apparatus
110 mask fabrication supporting system
111 mask blank factory
112 mask factory
113 data communication line (Internet)
114 server
142 mask pattern
143 dense pattern forming region
144 sparse pattern forming region
511 data transmission/reception section
512 process flow storage section
513 information storage section
514 defect information collation section
521 input section
522 data transmission/reception section
531 loader port
532 data transmission/reception section
533 recipe number-sputtering condition collation section
534 sputtering condition storage section
535 sputtering condition control section
536 sputtering apparatus
537 slot number, sputtering result, unloader slot number collection section
538 unloader port
541 data transmission/reception section
542 cassette number-recipe number collation section
543 loader port
544 defect inspection condition storage section
545 defect inspection condition control section
546 defect inspection apparatus
547 unloader port
548 unloader cassette number, unloader slot number assigning portion
571 data transmission/reception section
572 loader port
573 RC recipe number-resist coating condition, resist heating condition, resist cooling condition collation section
574 resist coating condition, resist heating condition, resist cooling condition storage section
575 resist coating condition, resist heating condition, resist cooling condition control section
576 resist coating apparatus
577 heater
578 cooler
579 unloader port
580 slot number, resist coating result, unloader slot number assigning section

BEST MODE FOR CARRYING OUT THE INVENTION

Description will be made about a mask blank film information acquisition method being a first embodiment of this invention. In the following description of the embodiment, film information includes surface information as described above and can be read as surface information as it is.

The mask blank film information acquisition method is carried out in parallel with processes in which a mask blank is manufactured by forming a first film, a second film, and a resist film on a glass substrate and then is placed in a receiving case. Each time the first film, the second film, and the resist film are each formed, an inspection of the film is carried out so that first-film film information, second-film film information, or resist-film film information is produced according to the result thereof and registered in a host computer. The host computer collects these film information to produce and store mask blank film information and outputs the stored mask blank film information to paper/electronic medium/communication line or the like in response to a request from the exterior.

Referring to FIG. 1, this figure is divided into upper, middle, and lower three stages by dotted lines. The lower stage shows the process flow, the middle stage shows mask blanks in the manufacture corresponding to respective processes, and the upper stage shows film information produced in inspection processes. Hereinbelow, description will be given along the process flow of the lower stage.

(1) Substrate Processing Process

Glass substrates formed with notch marks 1 are prepared. The notch mark indicates the kind of glass of the substrate by its shape. Then, the surfaces of each glass substrate are ground/polished so as to be finished to a predetermined surface roughness and flatness. After cleaning the glass substrate for removing abrasives used in the polishing process, the glass substrate is placed in a distribution case 2 with an ID tag attached. In the distribution case 2, the glass substrate is placed with its direction aligned on the basis of the notch mark 1.

(2) First Film Forming Process

By the use of a host computer that carries out production management, the ID tag attached to the distribution case 2 is assigned management numbers serving to manage the respective substrates. The host computer collects information about manufacturing process order, manufacturing condition setting, and respective manufacturing processes and records/stores it. The glass substrate placed in the distribution case 2 is transferred into a sputtering apparatus where a MoSiN halftone film being a first film is formed by reactive sputtering on the glass substrate on its side opposite to its side where the notch marks 1 are formed. In this event, film marks 3 are formed at positions where the MoSiN film is not formed due to a substrate holder. The MoSiN halftone film coated substrate is placed in a distribution case 4 different from the distribution case 2. Along with this, information of the completion of the first film formation is stored in the host computer. The management number is transferred to an ID tag attached to the distribution case 4. In the distribution case 4, the substrate is placed with its direction aligned on the basis of the notch mark 1 (or the film mark 3).

(3) First Film Inspection Process

The halftone film coated substrate placed in the distribution case 4 is transferred into a defect inspection apparatus that inspects a defect of the first film, where a defect inspection is carried out to acquire film information. As the film information (film surface information), position information of a defect, the size of a defect (the size is indicated by rank), and the type of a defect (pinhole, particle, or the like) are stored in the host computer per management number. The film information acquired here is called first-film film information. The substrate having been subjected to the defect inspection is placed in a different distribution case 5. Along with this, the management number is transferred to an ID tag of the distribution case 5. In the distribution case 5, the substrate is placed with its direction aligned on the basis of the notch mark 1 (or the film mark 3).

(4) Second Film Forming Process

The halftone film coated substrate placed in the distribution case 5 is transferred into an in-line sputtering apparatus where a Cr light shielding film being a second film is formed on the first film by reactive sputtering. In this event, film marks 6 are formed at positions where the Cr film is not formed due to a substrate holding portion. The Cr light shielding film coated substrate is placed in a different distribution case 7. Along with this, information of the completion of the second film formation is stored in the host computer. The management number is transferred to an ID tag attached to the distribution case 7. In the distribution case 7, the substrate is placed with its direction aligned on the basis of the notch mark 1 (or the film mark 3 or 6).

(5) Second Film Inspection Process

The Cr light shielding film coated substrate placed in the distribution case 7 is transferred into a defect inspection apparatus that inspects a defect of the second film, where a defect inspection is carried out to acquire film information (film surface information). As the film information, position information of a defect, the size of a defect (the size is indicated by rank), and the type of a defect (pinhole, particle, or the like) are stored in the host computer per management number. The film information acquired here is called second-film film information. The substrate having been subjected to the defect inspection is placed in a different distribution case 8. Along with this, the management number is transferred to an ID tag attached to the distribution case 8. In the distribution case 8, the substrate is placed with its direction aligned on the basis of the notch mark 1 (or the film mark 3 or 6).

(6) Resist Film Forming Process

The Cr light shielding film coated substrate placed in the distribution case 8 is transferred into a spin coating apparatus where a resist film is coated on the second film by a spin coating method, thereby forming the resist film through baking and cooling. The resist film coated substrate (mask blank) is placed in a different distribution case 9. Along with this, information of the completion of the resist film formation is stored in the host computer. The management number is transferred to an ID tag attached to the distribution case 9. In the distribution case 9, the mask blank is placed with its direction aligned on the basis of the notch mark 1 (or the film mark 3 or 6).

(7) Resist Film Inspection Process

The resist film coated substrate (mask blank) placed in the distribution case 9 is transferred into a defect inspection apparatus where a defect inspection is carried out to acquire film information. As the film information, position information of a defect, the size of a defect (the size is indicated by rank), and the type of a defect (pinhole, particle, or the like) are stored in the host computer per management number. The film information acquired here is called resist-film film information. The substrate having been subjected to the defect inspection is placed in a different distribution case 10. Along with this, the management number is transferred to an ID tag attached to the distribution case 10. In the distribution case 10, the mask blank is placed with its direction aligned on the basis of the notch mark 1 (or the film mark 3 or 6).

(8) Film Information Collation Process

The first-film film information, the second-film film information, and the resist-film film information are collated with each other, thereby confirming whether the directions coincide among the film information.

Specifically, the defect information data of the respective films are collated with each other on the basis of defects that do not change in position. This utilizes the fact that when a defect exists in the first film being a film at the lowermost layer, defects also occur in the second film and the resist film being films at layers above the first film, thereby judging based on the first-film film information whether or not the directions of the other film information are correct.

By this, the directions can be made consistent among the film information. However, for example, there is a possibility that when moving a substrate from a certain distribution case to another distribution case, the substrate may be placed in the distribution case with its direction being wrong. In this case, even if the directions agree among the film information, the directions of the film information and the substrate disagree.

In order to avoid such a possibility, when placing or removing a substrate in or from a distribution case or a receiving case, an operator refers to the notch mark 1 or the film mark 3 or 6 as the basis for the direction of the substrate and places or removes the substrate along a predetermined direction.

By this, the direction of the substrate in the mask blank manufacturing processes (1) to (9) can be kept constant so that it is possible to avoid disagreement between the directions of the substrate and the film information and make the directions consistent among the film information, and hence, the direction of the substrate and all the film information directions can be made consistent with each other. Further, since the consistency among the film information is confirmed, even if the substrate is placed in a distribution case or a receiving case with its direction being wrong in the manufacturing process, it can be detected.

(9) Blank Packaging Process

The mask blanks are placed in a receiving case 20 and packaged, and then delivered to a mask maker.

Herein, the receiving case 20 will be described with reference to FIGS. 2A and 2B. A unique case number 21 is assigned and attached to each of receiving cases 20. The receiving case 20 comprises a lid 22 and an outer box 23 and further comprises an inner box 24 and slots 25 in the outer box 23. The inner box 24 is received in the outer box 23 and serves as a substrate holder. Although the slot 25 is a partition between the substrates, a portion between the adjacent two slots 25 for storing the substrate will also be called a slot hereinbelow for the sake of explanation. In this sense, there are slots for storing five substrates in FIG. 2B. The slots are assigned slot numbers and called slot No. 1, slot No. 2, ... slot No. 5, respectively. Among outer surfaces of the outer box 23, a front indication 26 showing the direction of the receiving case 20 is described on the surface close to slot No. 1. The case number and the slot number are combined to identify a mask blank stored in the receiving case 20.

For correlation between the reference point of the position information of the film information in each mask blank and the reference point of each mask blank placed in the receiving case 20 for correlation with the foregoing reference point of the position information, when placing each mask blank in the receiving case 20, it is placed with its directivity aligned on the basis of the foregoing notch mark 1 (or the film mark 3 or 6). As described above, in each of the mask blank manufacturing processes, the film formation or the defect inspection is carried out while aligning the directivity of the substrate on the basis of the notch mark 1 (or the film mark 3 or 6) and, further, also in the substrate distribution case used for transferring the substrate between the respective processes, the substrate is placed with its directivity aligned on the basis of the notch mark 1 (or the film mark 3 or 6) and, also when providing the mask blank to the mask maker while placing it in the receiving case, the mask blank is placed with its directivity aligned on the basis of the notch mark 1 (or the film mark 3 or 6), so that the mask blank and the position information of the defect information can be accurately correlated with each other to thereby prevent pattern failure in the mask fabrication.

Referring back to the description of the blank packaging process, in this event, the blank film information including the first-film film information, the second-film film information, and the resist-film film information is provided per corresponding mask blank to the mask maker at the delivery destination. As blank film information providing methods, there are (a) attaching a print printed with the blank film information to the receiving case 20, (b) attaching to the receiving case 20 a recording medium such as a flexible disk or a CD-ROM recording the blank film information data, (c) transmitting the blank film information data to a computer or the like of the mask maker at the delivery destination through a data communication line, and so on. In the case of (a) or (b), the blank film information itself is attached to the receiving case 20 along with a correlation with slot numbers. In the case of (c), the mask maker transmits a case number and a slot number and receives the corresponding blank film information.

A cleaning process may be provided between the first film forming process and the first film inspection process and between the second film forming process and the second film inspection process.

Figure 3A:
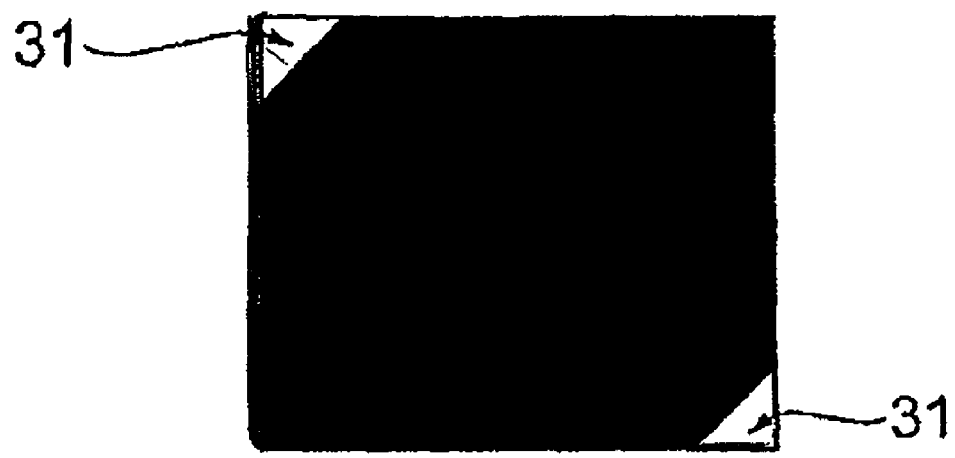
FIG. 3A is a diagram for explaining tray marks 31 indicating the front/back of a mask blank.
Figure 3B:
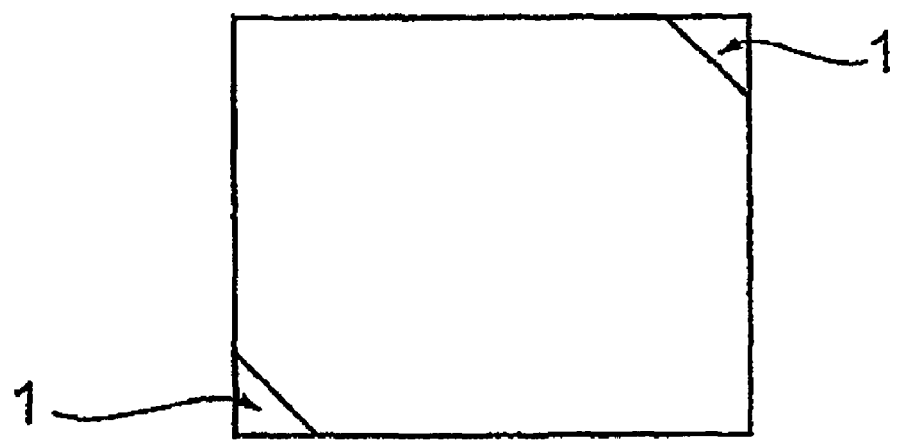
FIG. 3B is a diagram for explaining notch marks 1 indicating the front/back of the mask blank.

In the foregoing processes (1) to (10) and further in the mask maker, the front and back of the mask blank are identified by film marks 31 and notch marks 1 as shown in FIGS. 3A and 3B. On the front surface shown in FIG. 3A, the film marks 31 are given. On the back surface shown in FIG. 3B, the notch marks 1 are given.

Each film information comprises X and Y coordinates of an XY coordinate system predetermined on a film on the basis of a predetermined direction of a substrate, the size of a defect, and the type of a defect. The defect types comprise a pin hole and a particle. The particle represents a state where a granular substance is adhered on the film, while, the pinhole represents a state of a trace where a granular substance once adhered has fallen off.

FIG. 4 shows an example of blank film information. It is understood that when a defect exists at a position at the stage of a first film, defects occur at the same positions of both a second film and a resist film.

Figure 5:
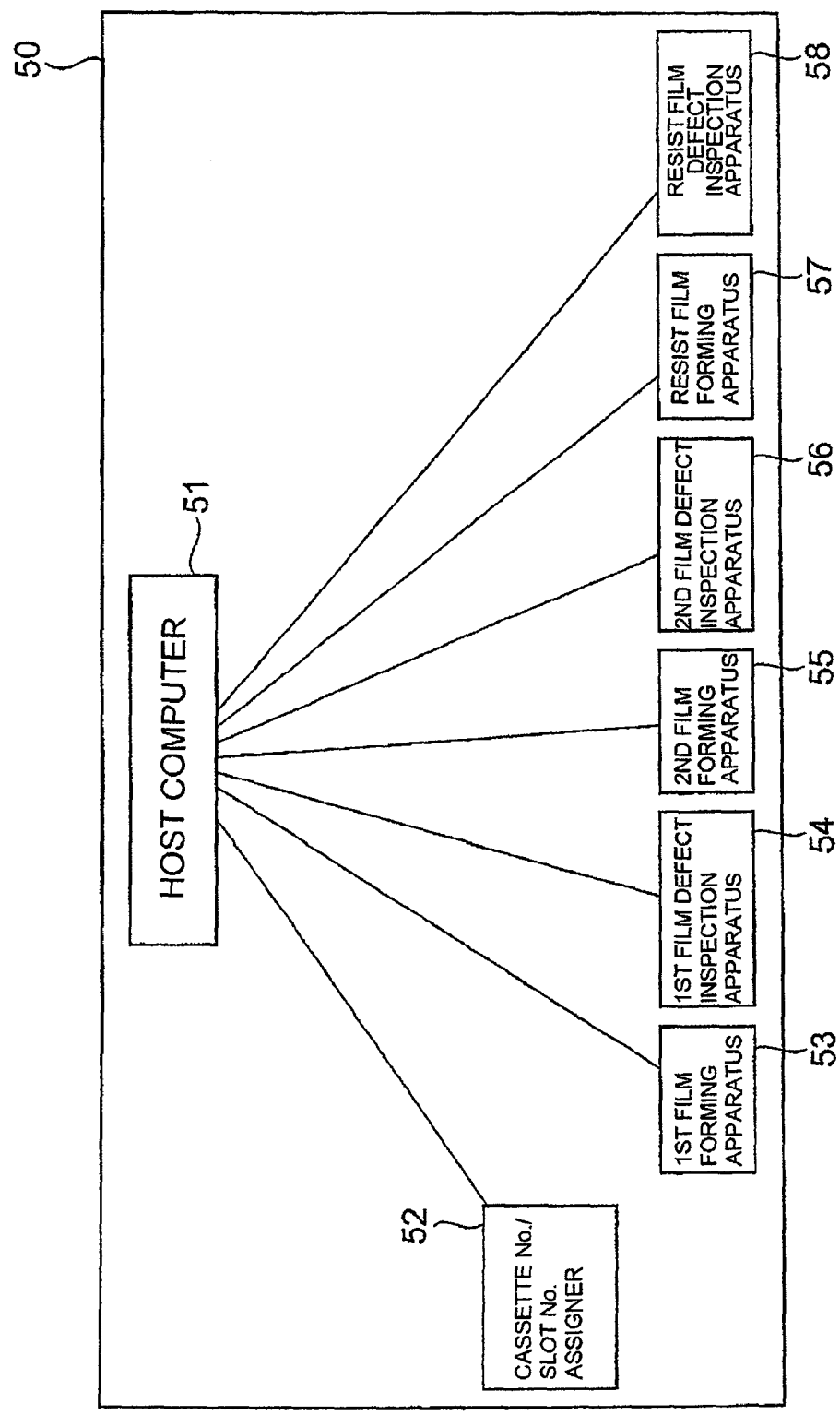
FIG. 5 is a block diagram for explaining a mask blank film information management system 50 of this invention.

Next, description will be made about a mask blank production line control system 50 being a second embodiment of this invention. Referring to FIG. 5, the mask blank production control system 50 comprises a host computer 51, a cassette number/slot number assigner 52 (hereinafter referred to as the assigner 52), a first film forming apparatus 53, a first film defect inspection apparatus 54, a second film forming apparatus 55, a second film defect inspection apparatus 56, a resist film forming apparatus 57, and a resist film defect inspection apparatus 58.

A cassette has a plurality of slots for receiving substrates therein and is provided with an ID tag. In the ID tag, a cassette number assigned to the cassette is recorded.

Referring to FIG. 7, when putting substrates on the production line, the substrates are placed in a cassette and a cassette number, slot numbers, and a process flow are input from an input section 521 in the assigner 52. The process flow includes a process order, a name of an apparatus for use in the process, and a recipe number for use in the apparatus and is given per cassette according to masks to be manufactured. On the production line, the substrate is identified by the position in the processes, the cassette number, and the slot.

The assigner 52 writes the cassette number in an ID tag of the cassette and, by the use of a data transmission/reception section 522, transmits the cassette number, the slot numbers, and the process flow to the host computer 51. Referring to FIG. 6, after reception at a data transmission/reception section 511, the host computer 51 stores the cassette number, the slot numbers, and the process flow in a process flow storage section 512 while correlating them with each other.

When the cassette finished with the input of the cassette number by the assigner 52 (hereinafter, this cassette will be referred to as the cassette A) is set in a loader port 531 of the first film forming apparatus 53, the first film forming apparatus 53 reads the cassette number from the ID tag of the cassette A and notifies it to the host computer 51 by the use of a data transmission/reception section 532.

Figure 8:
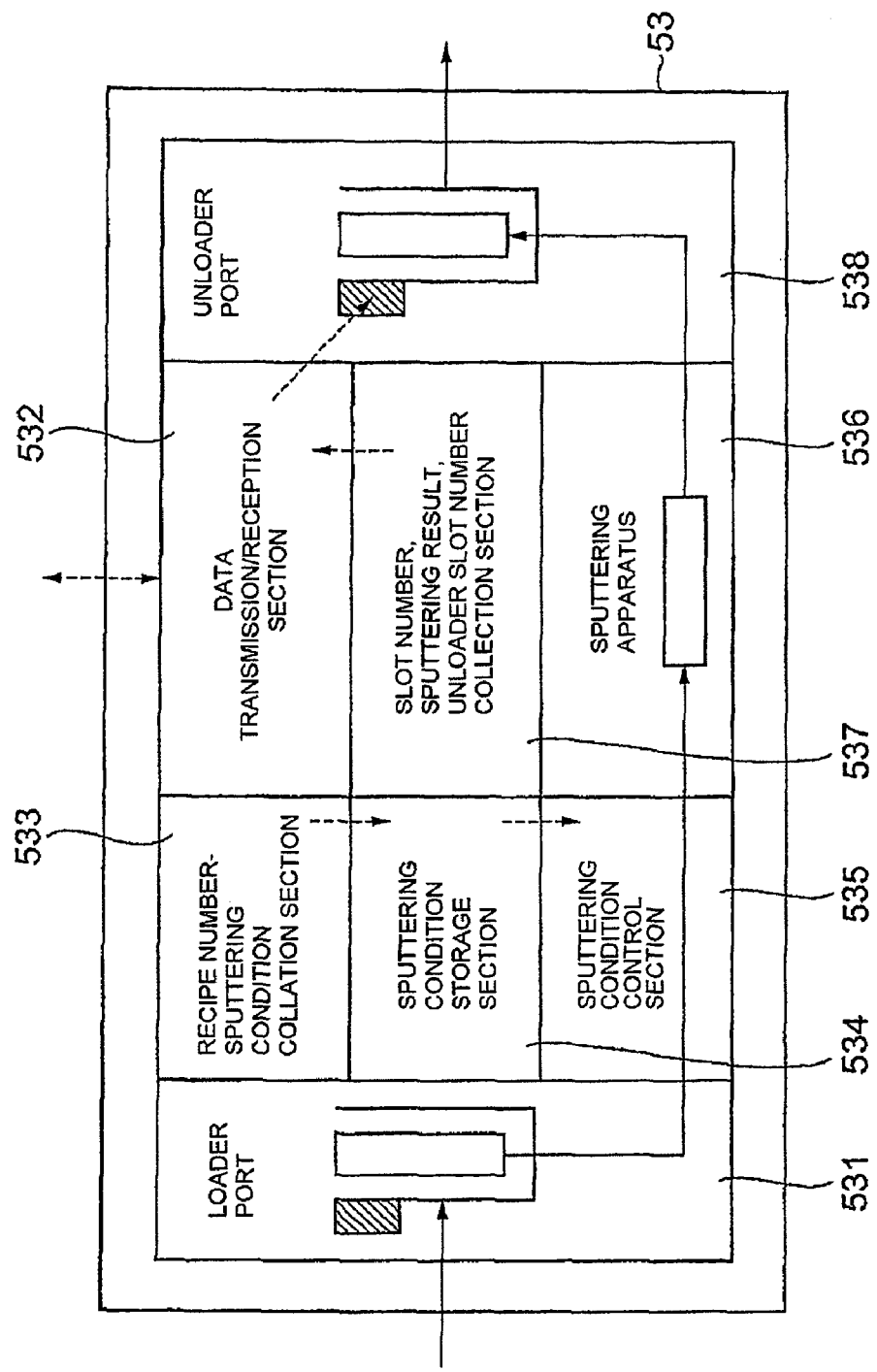
FIG. 8 is a block diagram for explaining a first film forming apparatus 53.

Referring to FIG. 8, the host computer 51, in response thereto, transmits the cassette number of the cassette A, the slot numbers, and the recipe number of sputtering to the first film forming apparatus 53. With respect to the recipe number, its transmission may be immediately before the start of operation of a sputtering apparatus.

In the first film forming apparatus 53 in receipt thereof, a recipe number-sputtering condition collation section 533 identifies a sputtering condition corresponding to the recipe number and stores the identified sputtering condition in a sputtering condition storage section 534. According to this sputtering condition, a sputtering condition control section 535 controls a sputtering apparatus 536 to carry out a sputtering process.

The sputtering apparatus 536 takes the substrate from the cassette A and starts the sputtering process. During the sputtering process, the sputtering results are collected and correlated with the slot number.

The substrate finished with the sputtering process enters a slot of another cassette (hereinafter referred to as the cassette B) prepared in advance in an unloader port 538. In this event, a slot number, sputtering result, unloader slot number collection section 537 (hereinafter referred to as the collection section 537) collects the slot number in the cassette A, the correlated sputtering results, and a slot number in the cassette B and transmits them to the host computer 51 by the use of the data transmission/reception section 532. When slots of the cassette B are all occupied by the substrates having been subjected to the first film formation, the collection section 537 notifies the host computer 51 to that effect as well as of a cassette number of the cassette B.

In response thereto, the host computer 51 specifies the next process in terms of the cassette number B, the cassette number A, and the process flow and notifies a transfer destination to a non-illustrated cassette transfer portion. Further, the host computer 51 transmits the cassette number of the cassette B and the recipe number of sputtering transmitted to the first film forming apparatus 53, to the first film defect inspection apparatus 54.

Figure 9:
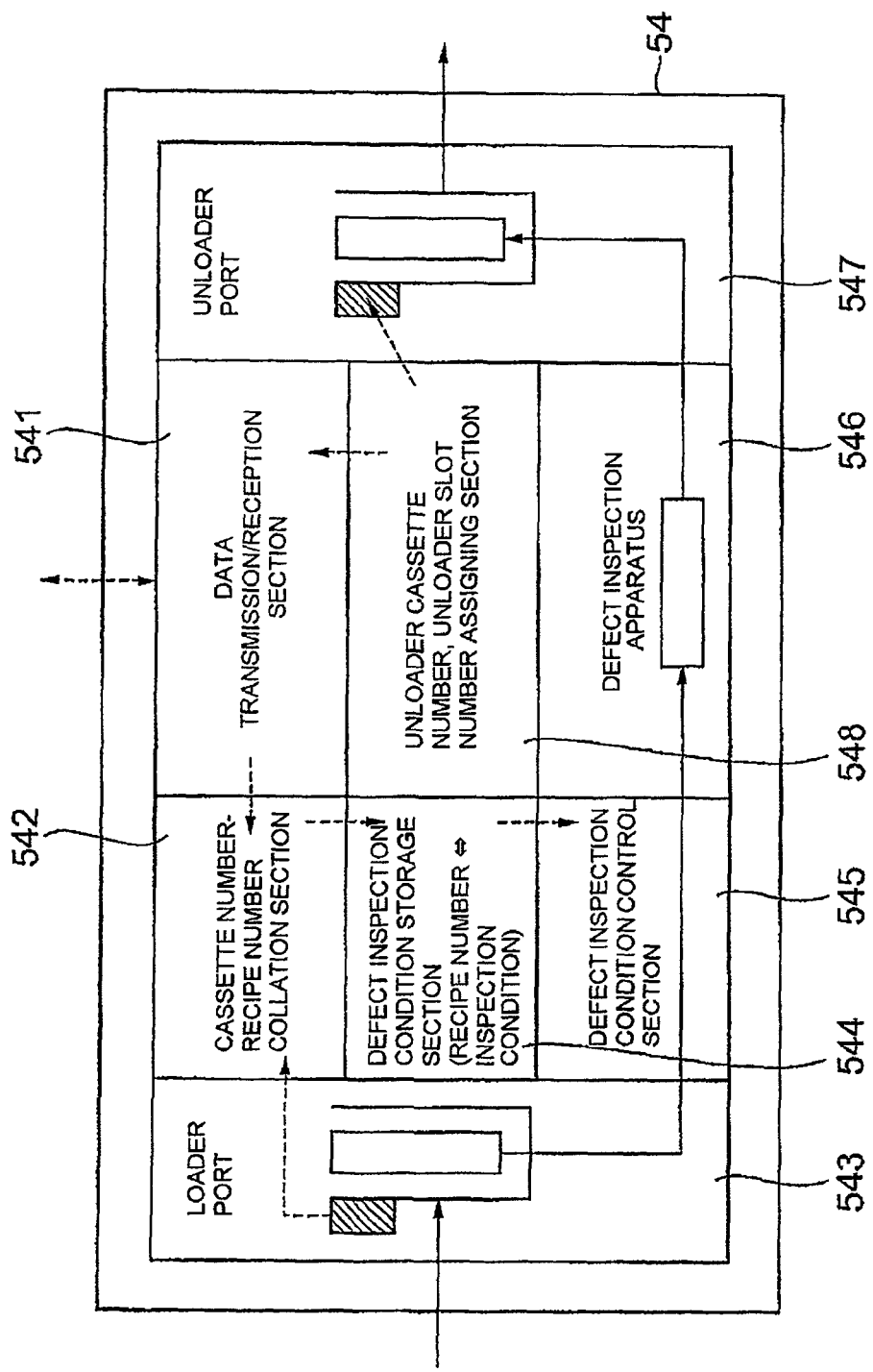
FIG. 9 is a block diagram for explaining a first film defect inspection apparatus 54.

Referring to FIG. 9, in response to receipt of them at a data transmission/reception section 541, the first film defect inspection apparatus 54 gives them to a cassette number-recipe number collation section 542.

When the cassette is carried into a loader port 543, the cassette number-recipe number collation section 542 identifies a recipe number corresponding to the cassette number read from an ID tag of the cassette. Herein, if the cassette number is that of the cassette B, there is obtained the recipe number that was used when the sputtering process was applied to the substrates placed in the cassette B.

In a defect inspection condition storage section 544, there is stored in advance a correlation between recipe numbers and inspection conditions to be carried out for films formed under recipe conditions indicated by the recipe numbers. In response to receipt of the recipe number from the cassette number-recipe number collation section 542, the defect inspection condition storage section 544 outputs the inspection condition to be carried out.

According to this inspection condition, a defect inspection condition control section 545 controls a defect inspection apparatus 546 to carry out an inspection. The defect inspection apparatus 546 outputs an inspection result as defect inspection information. The inspected substrate is placed in a slot of another cassette (hereinafter referred to as the cassette C) set in advance in an unloader port 547.

An unloader cassette number, unloader slot number assigning portion 548 assigns a cassette number to the cassette C and, by the use of the data transmission/reception section 541, transmits the cassette number of the cassette C, slot numbers of the cassette C, and the defect inspection information of the substrates placed in the slots to the host computer 51 while correlating them with each other.

The host computer 51 stores the transmitted information in an information storage section 513 while correlating it with the sputtering results and so on obtained in the first film forming apparatus 53.

Figure 10:
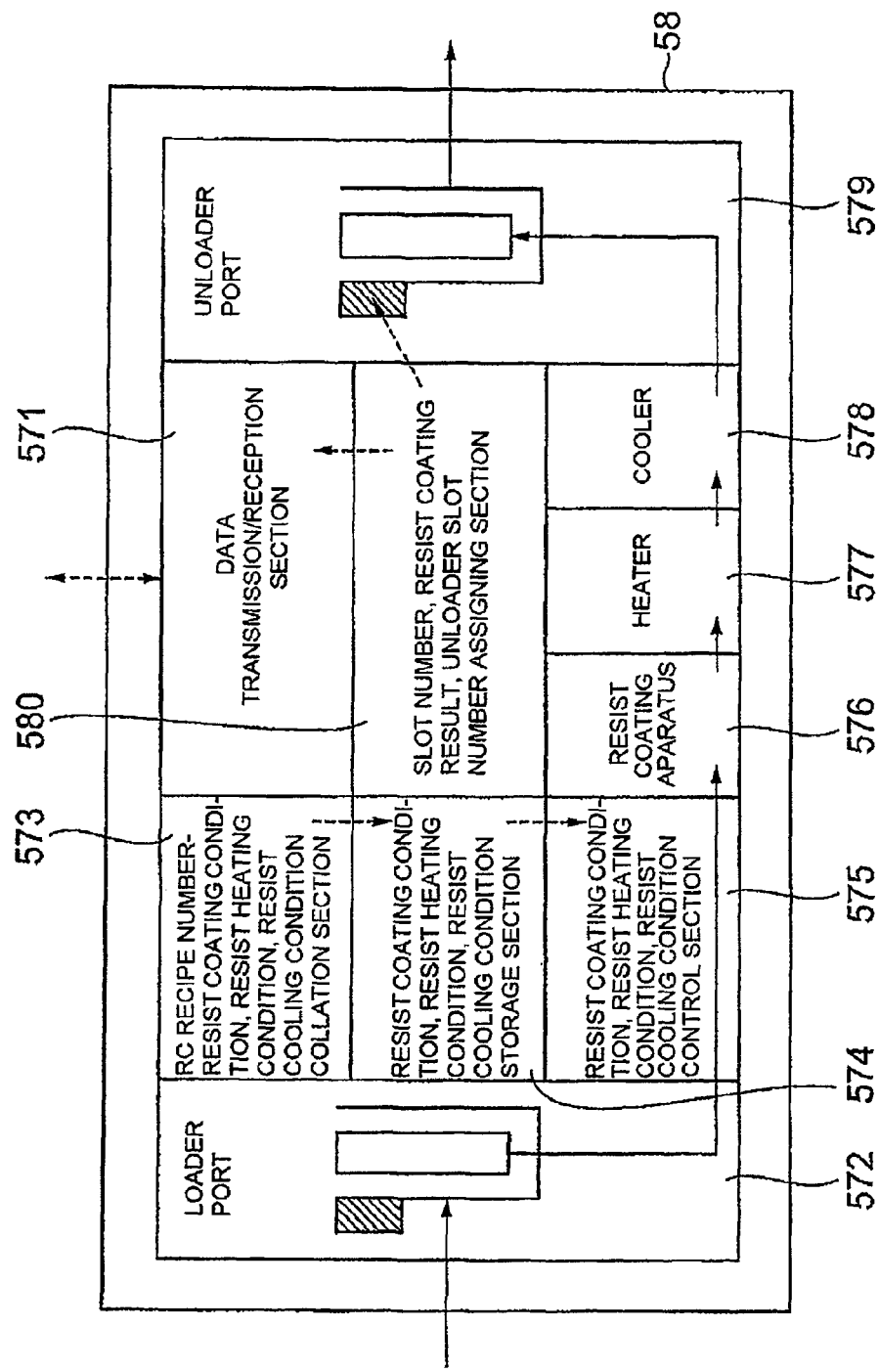
FIG. 10 is a block diagram for explaining a resist film forming apparatus 57.

With respect to the second film forming apparatus 55 and the second film inspection apparatus 56, explanation thereof is omitted because, as compared with the first film forming apparatus 53 and the first film inspection apparatus 54, respectively, there is a difference only due to difference in kind of a film to be formed, but no large difference in components and operation. This also applies to the resist film forming apparatus 57 and the resist film defect inspection apparatus 58 shown in FIG. 10.

Based on the information collected from the first film forming apparatus 53, the first film inspection apparatus 54, the second film forming apparatus 55, the second film inspection apparatus 56, the resist film forming apparatus 57, and the resist film inspection apparatus 58 as described above, a defect information collation section 514 produces the first-film film information, the second-film film information, and the resist-film film information described in the first embodiment and collates them with each other to produce the blank film information shown in FIG. 4.

Next, description will be made about a mask fabrication supporting system 110 being a third embodiment of this invention.

Figure 11:
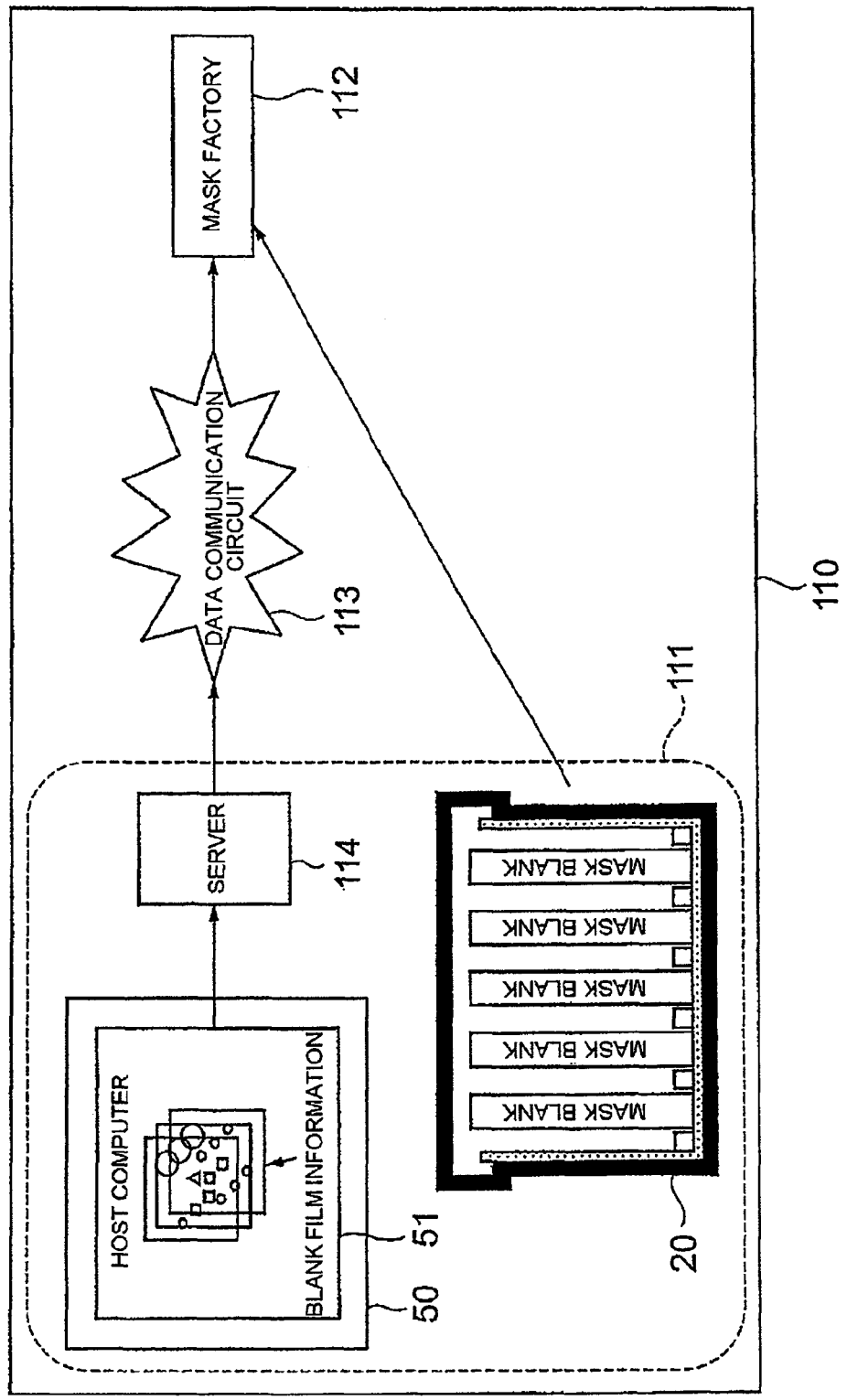
FIG. 11 is a block diagram for explaining a mask fabrication supporting system 110.

Referring to FIG. 11, the mask fabrication supporting system 110 comprises a mask blank factory 111, a mask factory 112 that manufactures masks based on mask blanks manufactured in the mask blank factory 111, and a data communication line 113 connecting both factories together. Further, the mask blank factory 111 comprises a host computer 51 and a server 114. The mask blanks manufactured in the mask blank factory 111 are delivered to the mask factory 112 while being placed in the foregoing receiving case 10. The host computer 51 is the foregoing host computer 51 of the mask blank production line control system 50. The server 114 receives necessary information from the host computer 51 and provides the information to a computer of the mask factory 112 at a remote place through the Internet 113.

Description will be made about a process of writing a pattern on a resist film of a mask blank in the mask fabrication supporting system 110.

As described in the second embodiment, blank film information of manufactured mask blanks is stored in the host computer 51 in advance. In the blank film information, its directivity is specified on the basis of a notch mark or a film mark so that its reference point is guaranteed. Further, the manufactured mask blanks are placed in a receiving case 10 such that the directivity of each mask blank is aligned on the basis of the notch mark or the film mark, so as to be delivered to the mask factory 112. In this event, the receiving case 10 is attached with a case number. The attachment of the case number is not limited to a visible state such as printing, and it may be attached in a mechanically readable state such as, for example, a barcode, a magnetic recording medium, or an IC chip.

Referring to FIG. 12, description will be made about a mask writing/development process in the mask factory 112. An operator, in receipt of a receiving case 10, in the mask factory 112 acquires a case number from the receiving case 10 visually or by mechanical reading and then, by the use of a data communication apparatus such as a computer, transmits the case number to the server 114 through the data communication line 113 such as the Internet. In response thereto, the server 114 transmits blank film information of mask blanks placed in respective slots of the receiving case of that case number (step S121).

Various manners can be considered as manners of data communication. For example, transmission of both a case number and blank film information may be carried out through electronic mails, or, a database representing a correlation between case numbers and blank film information of mask blanks placed in respective slots of receiving cases of those case numbers may be installed on the server 114 and the blank film information corresponding to the case number input from the side of the mask factory 112 may be transmitted in reply. At this stage, each mask blank has a section shown in FIG. 13A, wherein three-layer films, i.e. a first film, a second film, and a resist film, are formed on a glass substrate.

The mask factory 112 in receipt of the blank film information collates between the blank film information and a mask pattern of a mask to be manufactured (step S122). As described above, in this event, a reference point of position information in the mask blank and a reference point of position information in the blank film information correspond to each other. Alternatively, in this event, a reference point of position information in the mask blank and a reference point of position information of mask pattern data correspond to each other.

Now, it is assumed that the mask factory 112 is in receipt of blank film information 141 from the mask blank factory 111 and is going to write a mask pattern 142. The blank film information 141 includes first-film film information, second-film film information, and resist-film film information.

Generally, a mask pattern has a dense pattern forming region 143 where the density is high and a sparse pattern forming region 144 where the density is low.

On the other hand, generally, pinholes and particles of a mask blank are not uniformly distributed, but dispersed locally to some extent. Therefore, referring to the blank film information 142, the pattern writing position is determined through adjustment so that pinholes and particles are located in the region other than the dense pattern forming region 143 (step S123).

As a pattern writing position adjusting method, it is considered to change the direction of the mask pattern 142 with respect to the direction of the substrate. On the other hand, if it is possible to change the relative position relationship between the dense pattern forming region 143 and the sparse pattern forming region 144, the adjustment may be carried out by changing it.

Finally, in accordance with the determined pattern writing position, a pattern is written on the resist film and developed (step S124).

Next, a fourth embodiment will be described. In this embodiment, the technique of making the directions of blank film information and a substrate consistent with each other will be particularly taken up and described.

Referring again to FIGS. 1 and 3, the glass substrate of the mask blank is formed with the notch marks 1. In the conventional technique, the notch mark 1 is intended only for indicating the kind of glass of the glass substrate and indicates the kind of glass of the glass substrate by the difference in its shape.

Further, primarily for the purpose of indicating the kind of film, the film marks are formed on the film. Like the notch mark 1, the film mark indicates the kind of film by the difference in its shape and the position relationship between that film and another film. For example, the film mark 2 on the first film has a shape indicative of being the MoSiN film, while, the film mark 3 on the second film has a shape indicative of being the Cr film. In the figures, the film marks are shown in a simplified manner and hence do not agree with the actual shapes.

In this invention, these notch mark and film marks are used as references for the direction of the substrate, thereby always aligning the substrate in the same direction when placing or removing it in or from the container such as the distribution case, the cassette, or the receiving case. By this, the directions of the first-film film information, the second-film film information, and the resist-film film information all coincide with the direction of the substrate.

In this embodiment, the number of films of the film information may be one. It is applicable even to the defect information obtained by observing the surface of the mask blank immediately before shipping from the mask blank factory, i.e. observing only the surface film, as seen in the conventional technique. Even in this case, there is an effect of ensuring the consistency between the direction of the defect information and the direction of the substrate.

Next, a fifth embodiment of this invention will be described. The fifth embodiment is a modification obtained by changing part of an embodiment which collectively includes the foregoing first to fourth embodiments. Hereinbelow, description will be made about a mask blank information acquisition method, a mask fabrication supporting method, a manufacturing method of a mask blank to be provided to a mask maker, a transfer mask manufacturing method, and a method of acquiring and storing mask blank information in the manufacture of a mask blank. Further, specific examples of a mask blank information providing method and a mask blank providing method will also be disclosed.

In the following description of the embodiment, film information includes surface information and can be read as surface information.

The film information is plane information acquired by scanning the surface of a film. On the other hand, substrate information is plane information acquired by scanning the surface of a substrate. The plane information is information that can be comprehended by projecting it onto the plane coordinates being the two-dimensional coordinates.

Hereinbelow, there will be shown an example of acquiring substrate information or film information by the use of a defect inspection, wherein a defect represents a surface form or optical property that impedes the function of a transfer mask or causes an inferior transfer mask. Specifically, a particle-shaped defect and a pinhole-shaped defect can be cited as examples.

Figure 15:
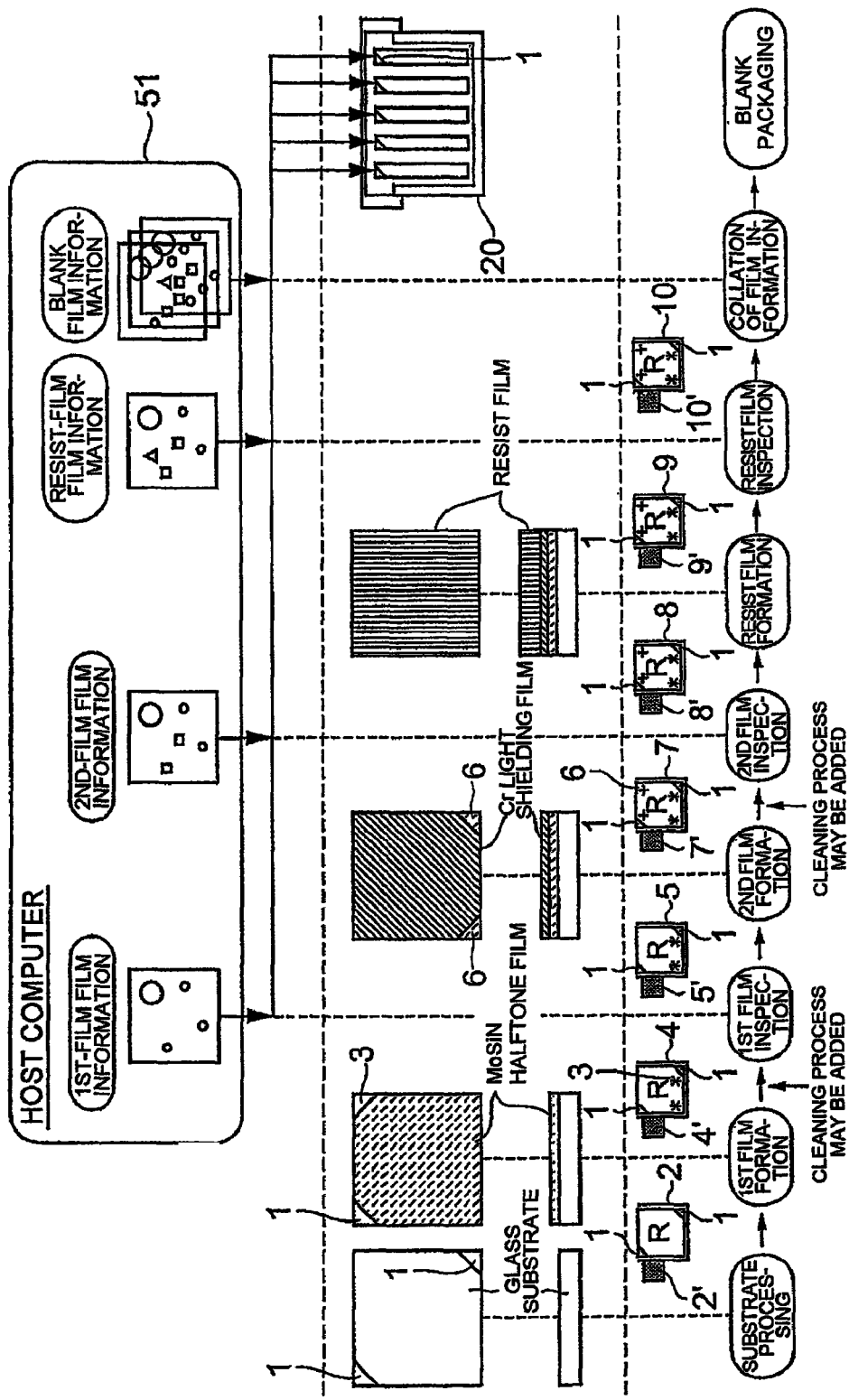
FIG. 15 is a flowchart for explaining mask blank manufacturing processes and a method of acquiring and storing mask blank film information in the manufacture of a mask blank, in a mask fabrication supporting method of this invention.

As shown in FIG. 15, mask blank information is acquired utilizing inspection processes that are carried out in parallel with processes in which a mask blank is manufactured by forming thin films, i.e. a first film, a second film, and a resist film, respectively, on a glass substrate and then is placed in a case. Although a substrate inspection is not shown in the example of FIG. 15, substrate information can be acquired by preparing the glass substrate having been subjected to processing such as mirror polishing and carrying out the substrate inspection prior to forming the first film.

In the embodiment shown in FIG. 15, each time the thin films, i.e. the first film, the second film, and the resist film, are each formed, a defect inspection of the thin film is carried out. Film information of the first film, film information of the second film, and film information of the resist film are produced according to the inspection results and then recorded and stored in a host computer while being correlated with each substrate (each mask blank). Thereafter, the substrate information and the film information recorded and stored in the host computer are collated to collectively produce mask blank information.

The mask blank information is produced by combining a plurality of plane information such as the substrate information, the first-film film information, the second-film film information, and the resist-film film information. The plurality of plane information forming the mask blank information are information relating to different sections of the same mask blank, respectively. Therefore, the mask blank information serves as information three-dimensionally showing the state of the inside of the mask blank.

The mask blank information is provided to a mask maker while being correlated with each of the mask blank individuals manufactured through the mask blank manufacturing processes and placed in a receiving case 20. The information is provided to the mask maker from a mask blank maker by the use of a paper document, an electronic medium, a magnetic medium, a communication line, or the like.

Referring to FIG. 15, this figure is divided into upper, middle, and lower three stages by dotted lines. The lower stage of FIG. 15 shows the mask blank manufacturing processes and the directivity of placement of a substrate or a mask blank in a cassette used for transferring the substrate between the respective processes, i.e. the longitudinal and lateral directions.

The middle stage of FIG. 15 shows the structures of films and the forms of film-coated substrates in the manufacture corresponding to respective processes. The upper stage of FIG. 15 shows the film information produced in the defect inspection processes. Hereinbelow, the method of acquiring and storing the film information will be described in detail along the flow of the mask blank manufacturing processes of the lower stage.

(1) Substrate Processing Process

Glass substrates formed with notch marks 1 are prepared. By the notch mark, the kind of glass of the glass substrate can be distinguished.

For example, the notch mark 1 has a plane shape formed by cutting in oblique section, at a corner of the glass substrate, three surfaces, i.e. the main surface and two end surfaces forming the corner, as shown in Japanese Unexamined Utility Model Application Publication (JP-U) No. S62-17948. The number of formed notch marks and the formed positions can also be used for distinguishing the kind of glass forming the glass substrate.

In the embodiment of this invention, the notch mark 1 serves as a reference mark for specifying the directivity of the substrate and also serves as a reference point in film information acquired in the later-described defect inspection processes.

Figure 16A:
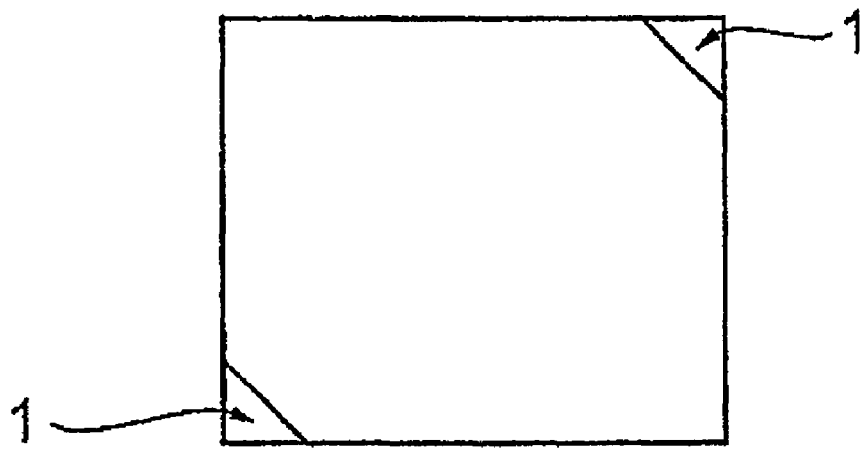
FIG. 16A is a diagram for explaining notch marks 1 of a mask blank.

As a specific example, notch marks 1 can be provided at two corners of a substrate on one main surface side thereof as shown in FIG. 16A. The kind of glass of this glass substrate formed with the notch marks 1 at the diagonal positions is a synthetic quartz glass.

Then, the surfaces of each glass substrate are ground/polished so as to be finished to a predetermined surface roughness and flatness. Further, the glass substrate is cleaned for removing abrasives used in the polishing process.

Then, the glass substrate is placed in an in-process distribution cassette 2 with an ID tag 2' attached. Hereinafter, this cassette will be referred to as the distribution cassette 2. This ID tag is information management means that can write or read information about a distribution cassette and substrates or mask blanks placed in the distribution cassette. The ID tag is a medium that can record and hold information. For example, an IC tag can be used.

The ID tag can be assigned and hold management numbers, for example, identification numbers, adapted to manage the respective substrates or mask blanks placed in the distribution cassette.

The management numbers include a cassette number assigned per distribution cassette and slot numbers assigned corresponding to a plurality of grooves provided for receiving a plurality of substrates in the distribution cassette. Based on the management numbers, the respective substrates can be identified and managed.

The management numbers assigned to the ID tag serve to correlate information of the respective processes acquired in the subsequent processes, for example, film information produced in the inspection processes of respective thin films, manufacturing conditions and manufacturing recipes used in the forming processes of respective thin films, and so on, with the respective substrates.

The distribution cassette 2 is configured so that the direction of the cassette, i.e. the front, back, left, and right of the cassette, can be distinguished. Further, a plurality of grooves each extending vertically are formed at predetermined intervals on two facing inner walls of the distribution cassette 2 so that the glass substrates or mask blanks can be placed in the respective grooves. In these plurality of grooves, the glass substrates or mask blanks are placed with their directions aligned on the basis of the notch marks 1.

Specifically, the glass substrates or mask blanks are placed so that the notch marks 1 formed on the glass substrates are arranged in a predetermined relationship to a predetermined position of the distribution cassette 2. The plurality of glass substrates or mask blanks in the cassette are arranged while being aligned in the same direction, so as to be placed.

In this embodiment, the glass substrates or mask blanks are placed so that the notch marks 1 of the glass substrates are located at specific positions on the front side of the distribution cassette 2.

That is, the glass substrates or mask blanks are placed such that, using the front of the distribution cassette 2 as a reference, the substrate surfaces formed with the notch marks 1 are arrayed so as to face the cassette front and, further, the notch marks of the glass substrates are aligned in the same positional relationship as seen from the cassette front.

In the subsequent processes, distribution cassettes that carry substrates between the respective processes have the same structure as that of the foregoing distribution cassette 2.

(2) First Film Forming Process

By the use of a host computer that carries out production management, the ID tag 2' attached to the distribution cassette 2 is assigned management numbers serving to manage the respective substrates. The host computer correlates the management numbers assigned to the ID tag with manufacturing process order in which the respective substrates should be processed and manufacturing conditions to be used in the respective processes. The host computer has the function of collecting information (e.g. substrate information, film information, etc.) from respective apparatuses in the manufacturing processes and recording/storing it per management number.

Specifically, the host computer that carries out production management assigns the management numbers, for managing the distribution cassette or the respective placed substrates, to the ID tag 2' attached per distribution cassette and records them. Further, the host computer correlates the management numbers assigned to the ID tag 2' with order of the plurality of manufacturing processes and inspection processes where the respective substrates are processed, the manufacturing conditions to be set in those processes, and so on. Further, the host computer has the function of collecting, recording, and storing, per substrate, information of the respective processes (e.g. substrate information, film information produced in the inspection processes of respective thin films, manufacturing conditions and manufacturing recipes used in the forming processes of respective thin films, and so on) acquired in the plurality of processes.

The glass substrates placed in the distribution cassette 2 are taken out one by one. The substrate is disposed on a holder of a sputtering apparatus so that the substrate surface on the side where the notch marks 1 are formed faces upward, while, the substrate surface on the side where the notch marks are not formed faces a sputtering target.

Then, by the use of a MoSi sputtering target, a halftone film being a phase shift film is formed on the surface of the glass substrate in a mixed gas atmosphere of argon gas and nitrogen gas by a reactive sputtering method.

The film is formed on the main surface of the glass substrate opposite (opposing surface) to the main surface where the notch marks 1 are formed. In the manner as described above, the phase shift film being the halftone film containing MoSiN is formed on the surface of the glass substrate.

The substrate holder is provided with shielding means so that the MoSiN halftone film is not formed in predetermined regions at the peripheral portion of the main surface of the substrate.

By this shielding means, the predetermined regions where the MoSiN film is not formed are formed on the main surface of the substrate and serve as film marks 3.

By the use of the difference in shape of the film mark 3, the position of the film mark, the arrangement thereof, or the like, it is possible to distinguish the kind of thin film formed on the glass substrate. In this embodiment, use is made of a film mark that is used for a halftone film.

Like the foregoing notch mark 1, the film mark 3 can be used as a reference mark for specifying the directivity of the substrate and as a reference point in film information acquired in the later-described inspection process.

Figure 16B:
FIG. 16B is a diagram for explaining film marks 31 of the mask blank.

As a specific example, film marks 31 can be provided at two corners on the main surface on the side opposite to the side where the notch marks 1 are formed, as shown in FIG. 16B.

The MoSiN halftone film coated substrates each formed with the MoSiN film on the surface of the glass substrate by the sputtering apparatus are placed in a distribution cassette 4 different from the distribution cassette 2. In the distribution cassette 4, the plurality of halftone film coated substrates are placed with their directions aligned on the basis of the notch marks 1 or the film marks 3.

Specifically, the substrates are placed so that the film marks 3 formed on the substrates are arranged in a predetermined relationship to a predetermined position of the distribution cassette 4.

In this embodiment, the plurality of halftone film coated substrates are placed so that the film marks 3 of the substrates are located at specific positions (on the lower side with respect to the distribution cassette in FIG. 15) on the back side of the distribution cassette 4.

That is, the substrates are placed such that, using the front of the distribution cassette 4 as a reference, the substrate surfaces on the side where the film marks 3 are not formed are arrayed so as to face the cassette front, i.e. the substrate surfaces formed with the notch marks 1 are arrayed so as to face the cassette front and, further, the film marks 3 of the substrates are aligned in the same positional relationship (on the lower side with respect to the distribution cassette in FIG. 15) as seen from the cassette front.

Information of the completion of the first film formation is stored per management number in the host computer.

Further, the information of the management numbers assigned to the ID tag 2' is transferred to an ID tag 4' attached to the distribution cassette 4. The management numbers transferred to the ID tag 4' may be the same as the management numbers assigned to the ID tag 2' or new management numbers may be assigned from the host computer. In the latter case, the management numbers newly assigned to the ID tag 4' are stored in the host computer while being correlated with the management numbers assigned to the ID tag 2'.

(3) First Film Inspection Process

This process includes a process of acquiring thin film information of the first film and a thin film information recording process of recording and storing the acquired film information in an information storage medium.

The halftone film coated substrate placed in the distribution cassette 4 is taken out and placed on a defect inspection apparatus that inspects a defect of the first film (MoSiN halftone film).

The substrate is placed on a holder while the surface formed with the notch marks 1 faces downward and the surface formed with the film marks 3 faces upward.

Thereafter, the surface of the film is scanned using the first-film defect inspection apparatus, thereby acquiring film information about the first film.

The film information is state information relating to the state of the film and surface information of the film acquired by scanning the surface of the film. As the film information, surface form information and optical property information can be cited. The acquired film information is configured such that it can be comprehended as two-dimensional plane information by projecting it onto the plane.

Position information (e.g. X and Y coordinates in the plane coordinate system) of a defect that may cause pattern failure in the mask manufacturing process, the size of the defect, the type of the defect, and so on are judged per defect by the defect inspection apparatus and its results are stored per management number in the host computer.

In this event, as the size of the defect, a measured value indicating the size of the defect such as a diameter may be stored as it is, or, a plurality of ranks for classifying the defect sizes may be determined in advance and the relevant rank may be stored as the size of the defect.

The type of the defect may be classified as a convex shape, a concave shape, or the other defect and stored. As the convex shape, there is, for example, a pinhole-shaped defect, while, as the concave shape, there is cited, for example, a particle-shaped defect.

The particle-shaped defect represents a defect in the state where foreign matter (e.g. granular or the like) is adhered on the film or in the film, while, the pinhole-shaped defect represents a trace where foreign matter once adhered in the film has fallen off, i.e. a defect in a film fall-off state. The film fall-off represents a state with no film at all where the state of an underlayer of the film can be confirmed or a state with a locally thinned film thickness where the state of an underlayer of the film cannot be confirmed.

The position information is stored as X and Y coordinates of each defect in an XY coordinate system formed by calculating, as a reference point (O), the center of the main surface of the glass substrate from the size of the glass substrate on the basis of the notch mark 1 and using, as virtual X and Y axes, lines passing through the reference point and parallel to sides of the glass substrate.

Specifically, at first, the center of the main surface of the glass substrate is calculated, as a reference point (O), from the size of the glass substrate, for example, the lengths of sides thereof, on the basis of the position of the notch mark 1, then, using the reference point (O) as the origin, an orthogonal plane coordinate system (XY coordinate system) is defined along the orthogonal sides of the glass substrate, and finally, an X-coordinate position and a Y-coordinate position of each defect is calculated in the two-dimensional XY coordinate system, thereby storing the foregoing defect position information in terms of values of the calculated X and Y coordinates.

The film information of the thin film acquired here is called first-film film information.

The halftone film coated substrates having been subjected to the defect inspection are placed in a distribution cassette 5 different from the distribution cassette 4. In the distribution cassette 5, the plurality of halftone film coated substrates are placed with their directions aligned on the basis of the notch marks 1 or the film marks 3.

Specifically, the substrates are placed so that the film marks 3 formed on the substrates are arranged in a predetermined relationship to a predetermined position of the distribution cassette 5.

In this embodiment, the plurality of halftone film coated substrates are placed so that the film marks 3 of the substrates are located at specific positions (on the lower side with respect to the distribution cassette in FIG. 15) on the back side of the distribution cassette 5.

That is, the substrates are placed such that, using the front of the distribution cassette 5 as a reference, the substrate surfaces formed with the notch marks are arrayed so as to face the cassette front, while, the surfaces formed with the film marks 3 are arrayed so as to face the side opposite to the cassette front, and further, the film marks 3 of the substrates are aligned in the same positional relationship (on the lower side with respect to the distribution cassette in FIG. 15) as seen from the cassette front.

Since the placement method is managed before the inspection so that the placing directions of the plurality of substrates are aligned as predetermined, the directivity, the coordinate system, and the reference point of the plane information acquired in the inspection process are coordinated among the plurality of substrates, thereby acquiring the information.

Since the placement method is managed after the inspection so that the placing directions of the plurality of substrates are aligned as predetermined, the directivity (direction) of the substrates subjected to processing is maintained also in the next process.

Along with this, the information of the management numbers assigned to the ID tag 4' is transferred to an ID tag 5' of the distribution cassette 5. As described above, the management numbers transferred to the ID tag 5' may be the same as the management numbers assigned to the ID tag 4' or new management numbers may be assigned.

The substrates placed in the cassette are transferred to the next process per cassette.

(4) Second Film Forming Process

Then, the halftone film coated substrate placed in the distribution cassette 5 is placed on a holder of an in-line sputtering apparatus. In this event, the substrate is placed on the holder while the substrate surface on the side formed with the notch marks 1 faces upward and the surface on the side formed with the film marks 3 faces downward.

By the use of a chromium (Cr) sputtering target, a light shielding film containing Cr (hereinafter referred to as the Cr light shielding film) being a second film is formed on the MoSiN halftone film being the first film in an argon gas atmosphere or in a mixed gas atmosphere of argon gas and oxygen gas and/or nitrogen gas by a reactive sputtering method.

In order to prevent formation of the Cr light shielding film in predetermined regions at the peripheral portion of the main surface of the substrate, the substrate holder is provided with shielding means. Accordingly, the predetermined regions where the Cr light shielding film is not formed are formed on the MoSiN halftone film so that film marks 6 are provided. By the shape of the film mark 6, the kind of film can be distinguished. In this embodiment, use is made of a film mark adapted for a Cr light shielding film.

Like the notch mark 1 formed on the glass substrate or the film mark 3 formed at the halftone film, the film mark 6 formed at the Cr light shielding film can be used as a reference mark for specifying the directivity of the substrate and as a reference point in film information acquired in the later-described defect inspection process.

In this embodiment, the MoSiN halftone film is covered with the Cr light shielding film. Therefore, it is difficult to see the film marks 3 from the side of the substrate where the films are formed. However, the film marks 3 given to the halftone film can be confirmed through the glass substrate from the main surface of the substrate on the opposite side. When specifying the directivity of the substrate by the use of the film marks 3, they can be utilized from the side of the substrate where the films are not formed.

The substrates each having the Cr light shielding film formed on the MoSiN halftone film by the in-line sputtering apparatus are placed in a distribution cassette 7 different from the distribution cassette 5. In the distribution cassette 7, the plurality of Cr light shielding film coated substrates are placed with their directions aligned on the basis of the film marks 6.

Specifically, the substrates are placed so that the film marks 6 formed on the substrates are arranged in a predetermined relationship to a predetermined position of the distribution cassette 7.

In this embodiment, the plurality of Cr light shielding film coated substrates are placed so that the film marks 6 of the substrates are located at specific positions (on the upper side with respect to the distribution cassette in FIG. 15) on the back side of the distribution cassette 7.

That is, the substrates are arrayed such that, using the front of the distribution cassette 7 as a reference, the surfaces on the side formed with the film marks 6 face the side opposite to the cassette front and the surfaces on the side formed with the notch marks 1 face the cassette front side. The substrates are placed so that the film marks 6 of the substrates are aligned in the same positional relationship (on the upper side with respect to the distribution cassette in FIG. 15) as seen from the cassette front.

Information of the completion of the second film formation is stored per management number in the host computer. The information of the management numbers assigned to the ID tag 5' is transferred to an ID tag 7' attached to the distribution cassette 7. As described above, the management numbers transferred to the ID tag 7' may be the same as the management numbers assigned to the ID tag 5' or new management numbers may be assigned.

The film coated substrates each having the first film and the second film stacked on the substrate are placed in the cassette 7 and transferred to the next process.

(5) Second Film Inspection Process

This process is similar to the first film inspection process. This process includes a process of acquiring thin film information of the second film and a thin film information recording process of recording and storing the acquired film information in an information storage medium.

The Cr light shielding film coated substrate placed in the distribution cassette 7 is set on a substrate placement stage of an inspection apparatus that inspects a defect of the second film (Cr light shielding film). In this event, the substrate is disposed while the surface formed with the notch marks 1 faces downward, the surface formed with the film marks 6 faces upward, and the notch marks 1 are located at predetermined positions with respect to the placement stage.

Like in the foregoing defect inspection of the first film, a defect inspection of the second film is carried out to acquire film information of the second film. The surface of the film is scanned using the second-film defect inspection apparatus, thereby acquiring the film information about the second film.

The film information is state information relating to the state of the film and surface information of the film acquired by scanning the surface of the film. As the film information, surface form information and optical property information can be cited. The acquired film information is configured such that it can be comprehended as two-dimensional plane information by projecting it onto the plane.

Position information (e.g. X and Y coordinates in the plane coordinate system) of a defect that may cause pattern failure in the mask manufacturing process, the size of the defect, the type of the defect, and so on are judged by the defect inspection apparatus and its results are stored per management number in the host computer.

The sizes of defects can be individually stored, but, for example, may be indicated by predetermined size ranks.

The type of the defect may be classified as a convex shape, a concave shape, or the other defect and stored. As the convex shape, there is, for example, a pinhole-shaped defect, while, as the concave shape, there is cited, for example, a particle-shaped defect.

The particle-shaped defect represents a defect in the state where foreign matter (e.g. granular or the like) is adhered on the film or in the film, while, the pinhole-shaped defect represents a trace where foreign matter once adhered in the film has fallen off, i.e. a defect in a film fall-off state. The film fall-off represents a state with no film at all where the state of an underlayer of the film can be confirmed or a state with a locally thinned film thickness where the state of an underlayer of the film cannot be confirmed.

The position information is stored as X and Y coordinates of each defect in an XY coordinate system formed by calculating, as a reference point (O), the center of the main surface of the glass substrate from the size of the glass substrate on the basis of the notch mark 1 and using, as virtual X and Y axes, lines passing through the reference point and parallel to sides of the glass substrate.

Like in the first film inspection process, at first, the center of the main surface of the glass substrate is calculated, as a reference point (O), from the size of the glass substrate, for example, the lengths of sides thereof, on the basis of the position of the notch mark 1, then, using the reference point (O) as the origin, an orthogonal plane coordinate system (XY coordinate system) is defined along the orthogonal sides of the glass substrate, and finally, an X-coordinate position and a Y-coordinate position of each defect is calculated in the two-dimensional XY coordinate system, thereby storing the foregoing defect position information in terms of values of the calculated X and Y coordinates. The film information acquired here is called second-film film information.

The Cr light shielding film coated substrates having been subjected to the defect inspection are placed in a distribution cassette 8 different from the distribution cassette 7. In the distribution cassette 8, the plurality of Cr light shielding film coated substrates are placed with their directions aligned on the basis of the film marks 6.

Specifically, the substrates are placed so that the film marks 6 formed on the substrates are arranged in a predetermined relationship to a predetermined position of the distribution cassette 8.

In this embodiment, the plurality of Cr light shielding film coated substrates are placed so that the film marks 6 of the substrates are located at specific positions (on the upper side with respect to the distribution cassette in FIG. 15) on the back side of the distribution cassette 8.

That is, using the cassette front of the distribution cassette 8 as a reference, the surfaces formed with the film marks 6 are arrayed so as to face the side opposite to the cassette front, i.e. the surfaces formed with the notch marks 1 are arrayed so as to face the cassette front. Further, the substrates are placed so that the film marks 6 of the substrates are aligned in the same positional relationship (on the upper side with respect to the distribution cassette in FIG. 15) as seen from the cassette front.

Since the placement method is managed before the inspection so that the placing directions of the plurality of substrates are aligned as predetermined, the directivity, the coordinate system, and the reference point of the plane information acquired in the inspection process are coordinated among the plurality of substrates, thereby acquiring the information.

Since the placement method is managed after the inspection so that the placing directions of the plurality of substrates are aligned as predetermined, the directivity (direction) of the substrates subjected to processing is maintained also in the next process.

The information of the management numbers assigned to the ID tag 7' is transferred to an ID tag 8' attached to the distribution cassette 8. As described above, the management numbers transferred to the ID tag 8' may be the same as the management numbers assigned to the ID tag 7' or new management numbers may be assigned.

The substrates placed in the cassette are transferred to the next process per cassette.

(6) Resist Film Forming Process

The Cr light shielding film coated substrate placed in the distribution cassette 8 is transferred into a spin coating apparatus where a resist film is coated on the second film by a spin coating method, thereby forming the resist film through baking and cooling.

In the manner as described above, a mask blank is fabricated in which the substrate, the first film, the second film, and the resist film are stacked together. There is a case where the resist film is not formed if necessary.

The fabricated mask blanks are placed in a distribution cassette 9 different from the distribution cassette 8. In the distribution cassette 9, the plurality of mask blanks are placed with their directions aligned on the basis of the film marks 6.

Specifically, the mask blanks are placed so that the film marks 6 formed on the substrates are arranged in a predetermined relationship to a predetermined position of the distribution cassette 9.

In this embodiment, the plurality of mask blanks are placed so that the film marks 6 of the mask blanks are located at specific positions (on the upper side with respect to the distribution cassette in FIG. 15) on the back side of the distribution cassette 9.

That is, the mask blanks are placed such that, using the cassette front of the distribution cassette 9 as a reference, the surfaces formed with the film marks 6 are arrayed so as to face the side opposite to the cassette front, i.e. the surfaces formed with the notch marks 1 are arrayed so as to face the cassette front, and further, the film marks 6 of the substrates are aligned in the same positional relationship (on the upper side with respect to the distribution cassette in FIG. 15) as seen from the cassette front.

Information of the completion of the resist film formation is stored per substrate number in the host computer. The information of the management numbers assigned to the ID tag 8' is transferred to an ID tag 9' attached to the distribution cassette 9. As described above, the management numbers transferred to the ID tag 9' may be the same as the management numbers assigned to the ID tag 8' or new management numbers may be assigned.

(7) Resist Film Inspection Process

This process is similar to the first film inspection process or the second film inspection process. This process includes a process of acquiring thin film information of the resist film and a thin film information recording process of recording and storing the acquired film information in an information storage medium.

The resist film coated substrate (mask blank) placed in the distribution cassette 9 is set on a substrate placement stage of a defect inspection apparatus that inspects a defect of the resist film.

In this event, the mask blank is placed on the stage while the surface formed with the notch marks 1 faces downward and the surface formed with the film marks 6 faces upward. Further, the mask blank is set so that the notch marks 1 are located at predetermined positions with respect to the stage.

A defect inspection of the resist film is carried out to acquire film information of the resist film. The surface of the film is scanned using the resist-film defect inspection apparatus, thereby acquiring the film information about the resist film.

The film information is state information relating to the state of the film and surface information of the film acquired by scanning the surface of the film. As the film information, surface form information and optical property information can be cited. The acquired film information is configured such that it can be comprehended as two-dimensional plane information by projecting it onto the plane.

Position information (e.g. X and Y coordinates in the plane coordinate system) of a defect that may cause pattern failure in the mask manufacturing process, the size of the defect, the type of the defect, and so on are judged by the defect inspection apparatus and its results are stored per management number in the host computer.

The position information is stored as X and Y coordinates of each defect in an XY coordinate system formed by calculating, as a reference point (O), the center of the main surface of the glass substrate from the size of the glass substrate on the basis of the notch mark 1 and using, as virtual X and Y axes, lines passing through the reference point and parallel to sides of the glass substrate.

Like in the foregoing first film inspection process and second film inspection process, at first, the center of the main surface of the glass substrate is calculated, as a reference point (O), from the size (lengths of sides) of the glass substrate on the basis of the position of the notch mark 1, then, using the reference point (O) as the origin, an orthogonal coordinate system (XY coordinate system) is defined along the orthogonal sides of the glass substrate, and finally, an X-coordinate position and a Y-coordinate position of each defect is calculated in the XY coordinate system, thereby storing the foregoing defect position information in terms of values of the calculated X and Y coordinates. The film information acquired here is called resist-film film information.

The mask blanks having been subjected to the defect inspection are placed in a distribution cassette 10 different from the distribution cassette 9. In the distribution cassette 10, the plurality of mask blanks are placed with their directions aligned on the basis of the film marks 6.

Specifically, the mask blanks are placed so that the film marks 6 formed on the substrates are arranged in a predetermined relationship to a predetermined position of the distribution cassette 10.

In this embodiment, the plurality of mask blanks are placed so that the film marks 6 of the mask blanks are located at specific positions (on the upper side with respect to the distribution cassette in FIG. 15) on the back side of the distribution cassette 10. That is, the mask blanks are placed such that, using the cassette front of the distribution cassette 10 as a reference, the surfaces formed with the film marks 6 are arrayed so as to face in a direction opposite to the cassette front, i.e. the surfaces formed with the notch marks 1 are arrayed so as to face the cassette front, and further, the film marks 6 of the substrates are aligned in the same positional relationship (on the upper side with respect to the distribution cassette in FIG. 15) as seen from the cassette front.

Since the placement method is managed before the inspection so that the placing directions of the plurality of mask blanks are aligned as predetermined, the directivity, the coordinate system, and the reference point of the plane information acquired in the inspection process are coordinated among the plurality of mask blanks, thereby acquiring the information.

Since the placement method is managed after the inspection so that the placing directions of the plurality of mask blanks are aligned as predetermined, the directivity (direction) of the mask blanks is maintained also in the next process.

The information of the management numbers assigned to the ID tag 9' is transferred to an ID tag 10' attached to the distribution cassette 10. As described above, the management numbers transferred to the ID tag 10' may be the same as the management numbers assigned to the ID tag 9' or new management numbers may be assigned.

(8) Film Information Collation Process

The film information acquired with respect to the respective thin films, i.e. the first film, the second film, and the resist film, formed in order on the glass substrate are collated with each other. When the substrate information has been acquired, the substrate information and the film information can be collated.

The film information relating to the mask blank to be collated can be identified by the management number.

In this invention, the film information is acquired as the plane information. The reference point of position in the plane information is acquired so as to have the predetermined relationship to the notch mark or the film mark provided on the substrate or the mask blank so as to serve as the reference mark. Further, when acquiring the film information or the plane information, the information is acquired while the substrates or the mask blanks are all aligned in the same direction.

By collating the first-film film information, the second-film film information, and the resist-film film information with each other, it is possible to verify whether the respective film information are surface information with the consistent direction. Further, based on the verification results, the directions of the respective film information can be made consistent with each other.

Specifically, the film information of the respective films can be collated on the basis of a shape that does not change in position, i.e. is located at the same position, on the substrate before and after the film forming process.

For example, when a specific shape such as a defect exists in the first film being a film at the lowermost layer, the shape of the first film is reflected also on the second film and the resist film being films at layers above the first film and hence it is possible to confirm by collation on the basis of the first-film film information whether the directivities of the other film information, i.e. the reference points or the XY coordinate systems in the position information, coincide with each other.

For example, when a defect exists in the first film being a film at the lowermost layer, defects also occur in the second film and the resist film being films at layers above the first film and hence it is possible to judge based on the defect included in the first-film film information whether or not the directions of the other film information are correct.

FIG. 17 shows an example where first-film film information, second-film film information, and resist-film film information are collated. In FIG. 17, the collation is carried out on the basis of defects commonly detected in the first-film film information, the second-film film information, and the resist-film film information. Specifically, it is the example where the film information of the second film and the resist film are collated on the basis of defects (portion where □, Δ, and x overlap each other) that do not change in position coordinates on the substrate and thus are located at the same position.

By carrying out the collation of the film information as described above, the directivities (directions) of the respective film information, i.e. the reference points and the XY coordinate systems in the position information, can be made consistent with each other.

On the other hand, for example, the possibility is considered that when moving a substrate from a certain distribution cassette to another distribution cassette, the substrate may be placed in the distribution cassette with its directivity being wrong. Further, the possibility is considered that when moving a substrate from a distribution cassette to each inspection apparatus or from each inspection apparatus to a distribution cassette, the substrate may be placed or removed with its directivity being wrong. In this case, there is a possibility that the directions of the film information and the mask blank disagree.

In order to avoid such a possibility, when placing or removing a substrate or a mask blank in or from a distribution cassette or a receiving case or when setting a substrate in the defect inspection apparatus for each film, an operator refers to a notch mark 1 or a film mark 3 or 6 as a reference mark indicating the direction of the substrate and places or removes the substrate or the mask blank according to a predetermined directivity (direction).

Specifically, as described before, with respect to a distribution cassette that carries substrates or mask blanks between the respective processes, the substrates or the mask blanks may be placed such that notch marks of the substrates or the mask blanks are arrayed so as to face the front side of the distribution cassette and the notch marks are aligned at the predetermined position.

The description has been made about the case where the front indication of the cassette is given for convenience' sake. However, for example, if the direction of a cassette is always ensured to be the same direction, the visible front indication is not necessarily required. Further, if the direction of a cassette is seized and managed by the host computer or the like, the visible front indication is not necessarily required.

Substrates or mask blanks are placed while film marks 3 are arranged at the lower position in a distribution cassette and film marks 6 are arranged at the upper position in the distribution cassette.

Further, when setting a substrate or a mask blank in the defect inspection apparatus for each film, the substrate or the mask blank may be placed on the stage so that notch marks or film marks face in the predetermined direction and further the notch marks or the film marks are located at the predetermined positions with respect to the stage, thereby carrying out the predetermined inspection.

By this, it is possible to prevent in advance occurrence of inconsistency in directivity (direction) among film information. Further, it is possible to prevent in advance occurrence of inconsistency between the directivity (direction) of the film information and the directivity (direction) of the placed mask blank.

By keeping constant the directivity (direction) of the substrate or the mask blank during the manufacture of the mask blank, the reference point and the XY coordinate system of the mask blank can be made consistent and, further, the reference point and the XY coordinate system of the mask blank can be made consistent with the reference point and the XY coordinate system of the film information of each film.

As described above, since the mask blank information is configured such that the plane coordinates and the position reference points of the position information included in the film information and the substrate information can be correlated with each other, the mask blank information can be recognized as internal three-dimensional information inside the mask blank body.

Further, since the mask blank information has been subjected to the foregoing collation process, it can be guaranteed as highly reliable three-dimensional information inside the mask blank body.

(9) Mask Blank Packaging Process

The mask blanks are placed in a receiving case 20 and packaged, and then delivered to a mask maker.

Herein, the receiving case 20 will be described with reference to FIGS. 18A and 18B. A unique case number 21 is assigned and attached to each of receiving cases 20.

This case number 21, along with later-described slot numbers, are assigned while being correlated with the managing numbers assigned for correlation between the respective substrates and the information (e.g. film information) of the respective processes in the foregoing manufacture of the mask blanks. Further, the case number 21 is correlated with the film information of the respective films or the substrate information stored in the host computer.

Although the case number 21 is attached to the receiving case 20, the attachment of the case number 21 is not limited to a visible state such as printing and it may be attached as a readable medium such as, for example, a barcode, a magnetic recording medium, an IC chip, or an IC tag.

The receiving case 20 comprises a lid 22 and an outer box 23, wherein an inner box 24 is further received in the outer box 23. In the inner box 24, a plurality of slots 25 being partitions are formed from upper to lower and a plurality of grooves are formed at predetermined intervals between the slots 25 so that mask blanks can be received in these grooves.

Although the slot 25 is a partition between the mask blanks, a groove portion between the adjacent two slots 25 for storing the substrate will also be called a slot hereinbelow for the sake of explanation. In this sense, there are five grooves, i.e. five slots, for storing five substrates in FIG. 18B.

Slot numbers are assigned corresponding to the grooves, which are called slot No. 1, slot No. 2, . . . slot No. 5, respectively. Among outer surfaces of the outer box 23, a front indication 26 showing the direction of the receiving case 20 is described on the surface close to slot No. 1.

The mask blanks are placed in the respective grooves (slot No. 1, slot No. 2, . . . slot No. 5) while the notch marks 1 formed on the mask blanks are arranged at specific positions on the side of the front indication 26 and, further, the film marks 3 are arranged on the lower side with respect to the receiving case and the film marks 6 are arranged on the upper side with respect to the receiving case, so as to be packaged.

By the combination of the foregoing case number and slot numbers, it is possible to identify the mask blank individuals stored in the receiving case 20. By the case number and the slot number, the film information of the respective films or the substrate information stored in the host computer is correlated so that the mask blank information is specified.

As described above, also in the packaging process, by placing the mask blanks in the respective grooves while the notch marks 1 formed on the mask blanks are arranged at the specific positions on the side of the front indication 26, the film marks 3 are arranged on the lower side with respect to the receiving case, and the film marks 6 are arranged on the upper side with respect to the receiving case, the reference point and the XY coordinate system of each mask blank and the reference point and the XY coordinate system of the film information of each film or the substrate information can be made consistent with each other.

Accordingly, the mask blank individual and the mask blank information relating to such a mask blank individual can be accurately correlated with each other, so that it is possible to prevent pattern failure in the mask fabrication.

Further, a mask fabricator can comprehend not only the surface information of the mask blank, but also the internal state of the mask blank.

Next, referring to FIG. 19, description will be made about a mask blank providing method of providing to a mask maker the mask blanks stored in the receiving case finished with the blank packaging process and the film information of those mask blanks, and a mask fabrication supporting system.

As described above, the mask blank individual information (mask blank information) including the first-film film information, the second-film film information, and the resist-film film information stored per management number in the host computer is provided to the mask maker along with the mask blanks stored in the receiving case, while being correlated with the mask blank individuals identified by the case number and the slot numbers.

As mask blank film information providing methods, there are (a) attaching a print printed with the information to the receiving case 20, (b) attaching to the receiving case 20 a recording medium such as a flexible disk or a CD-ROM recording the information data, (c) transmitting the information data to a computer or the like of the mask maker at the delivery destination through a data communication line, and so on.

In the case of (a) or (b), the information itself is attached to the receiving case 20 along with a correlation with slot numbers. In the case of (c), the mask maker transmits a case number and a slot number and receives the corresponding information.

The information may be mapped as shown in FIG. 17 so that it can be visually seen how respective defects are arranged or may be in the form of a data sheet about the type of each defect, the size of each defect, and position information (X coordinate, Y coordinate) of each defect. Although the information is generally provided to the mask maker as the film information of each film, the film information of the respective films may be provided to the mask maker as a single defect map as shown in FIG. 17.

As described above, in this embodiment, the position information, for example, the defect position information, in the substrate information or the film information acquired as the plane information is given by X and Y coordinates of each defect in the XY coordinate system formed by calculating, as a reference point (O), the center of the main surface of the substrate on the basis of the notch mark 1 and passing through this reference point and, further, the mask blanks stored in the receiving case are placed so that the notch marks 1 are located at the specific positions with respect to the receiving case. Therefore, the information and the mask blanks are provided to the mask maker in the state where the reference point and the coordinate system in each of the mask blanks stored in the receiving case and the reference point and the coordinate system in the position information can be comprehended in terms of their correlation or are made consistent with each other.

As described above, the mask blank information corresponding to the respective mask blank individuals is provided to the mask maker. The mask blank individuals to be provided are each provided to the mask maker in the state where its position reference point and coordinate system correspond to the position reference point and the coordinate system of the blank film information.

The mask maker utilizes the means such as the case number and the slot number, or the management number or management symbol indirectly assigned to each of the mask blanks for specifying it to thereby identify each of the provided mask blank individuals and, through the reference points and the coordinate systems in the foregoing predetermined relationship, can perform collation between each of the provided mask blanks and the mask blank information. Further, through the reference points and the coordinate systems in the foregoing predetermined relationship, it is possible to accurately comprehend the states such as the surface forms of the individual mask blanks.

Therefore, a region on each mask blank where a predetermined transfer pattern (mask pattern) is to be formed can be properly specified as required. Thus, it is possible to suppress pattern formation failure of the pattern to be formed.

The mask maker can specify a region on each mask blank where a mask pattern including a transfer pattern is to be formed and pattern a thin film formed on the mask blank, thereby fabricating a transfer mask.

Next, using as a specific example the foregoing providing method (c) of providing the information through the data communication line, a mask fabrication supporting system 110 of this invention will be described with reference to FIG. 19.

Figure 19:
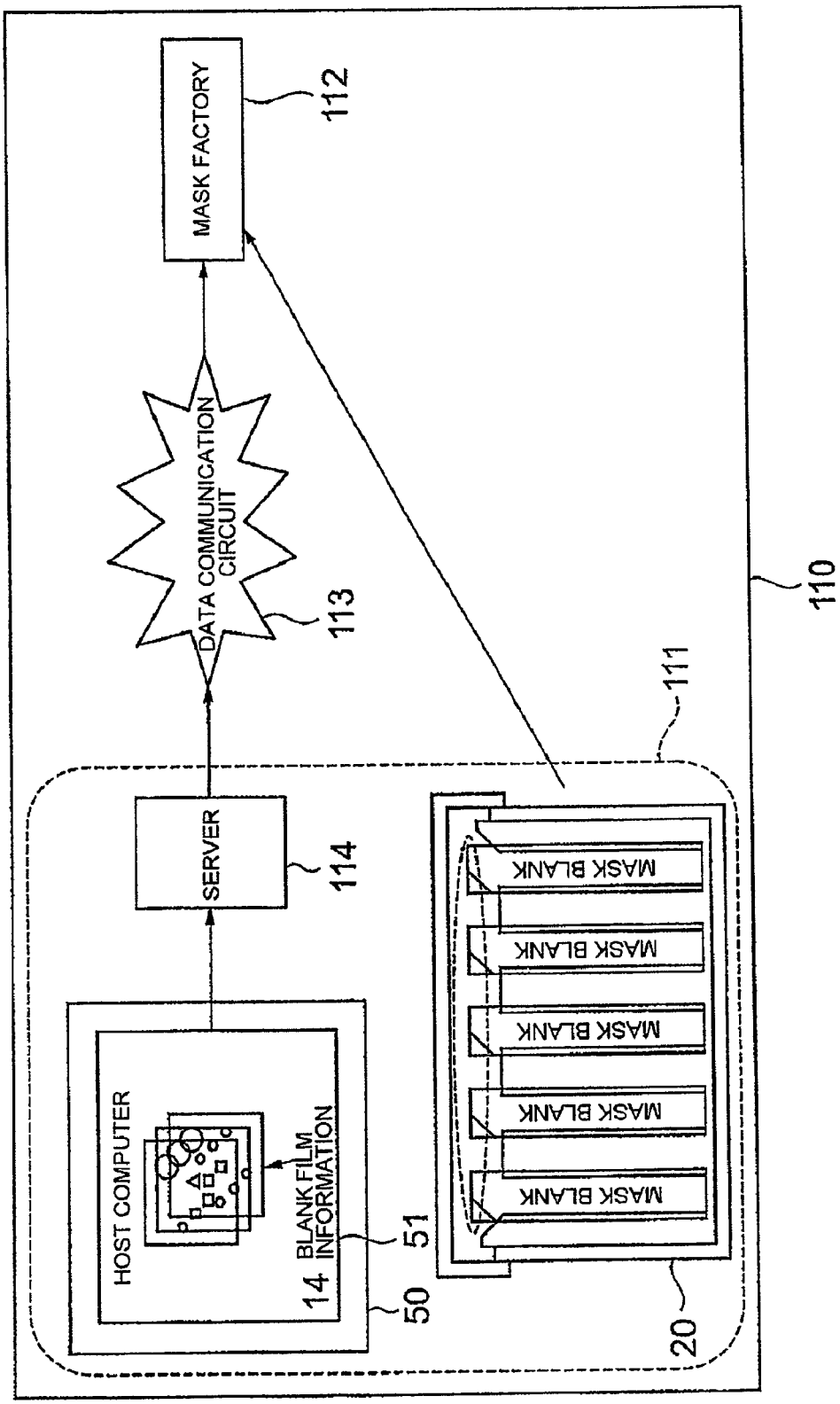
FIG. 19 is a block diagram for explaining a mask fabrication supporting system 110.

Referring to FIG. 19, the mask fabrication supporting system 110 comprises a mask blank factory 111, a mask factory 112 that manufactures masks based on mask blanks manufactured in the mask blank factory 111, and a data communication line 113 connecting both factories together. Further, the mask blank factory 111 comprises a host computer 51 and a server 114.

The mask blanks manufactured in the mask blank factory 111 are delivered to the mask factory 112 while being placed in the foregoing receiving case 10. The host computer 51 is the foregoing host computer 51 of the mask blank production line control system 50.

The server 114 receives necessary information (film information etc.) from the host computer 51. In the server 114, case numbers and slot numbers adapted to identify the mask blanks delivered to the mask factory 112 and the blank film information are stored while being correlated with each other. The server 114 provides the predetermined information to a computer of the mask factory 112 at a remote place through the Internet 113.

The case numbers and the slot numbers adapted to identify the mask blanks delivered to the mask factory 112 and the mask blank information such as the film information may be stored in the host computer 51 while being correlated with each other.

Next, referring to FIG. 20, description will be made about one example of the mask manufacturing process including a process carried out by the mask factory 112 for writing/developing a pattern on a resist film of each mask blank by the use of the information received in the mask fabrication supporting system 110.

An operator, in receipt of a receiving case 10, in the mask factory 112 acquires a case number from the receiving case 10 visually or by mechanical reading and then, by the use of a data communication apparatus such as a computer, transmits the case number to the server 114 through the data communication line 113 such as the Internet. In response thereto, the server 114 transmits film information of mask blanks placed in respective slots of the receiving case of that case number, while correlating the film information with the case number and slot numbers (step S121).

Various manners can be considered as manners of data communication. For example, transmission of both information such as a case number and slot numbers for identifying mask blank individuals and mask blank information such as film information may be carried out through electronic mails.

Alternatively, a database representing a correlation between case numbers and information of mask blanks placed in respective grooves of receiving cases of those case numbers may be installed on the server 114 and the mask blank information such as the film information corresponding to the case number input from the side of the mask factory 112 may be transmitted in reply.

At this stage, each mask blank has a section shown in FIG. 21A, wherein films of a plurality of layers, i.e. a first film (halftone film), a second film (light shielding film), and a resist film, are stacked on a glass substrate.

The mask factory 112 in receipt of the film information collates between the acquired film information and mask pattern data of a mask to be manufactured (step S122).

As described above, in this event, a reference point and an XY coordinate system of the mask blank and a reference point and an XY coordinate system of position information in the film information correspond to each other. Therefore, by the collation between the film information and the mask pattern data, it is possible to determine the arrangement of a mask pattern with respect to the mask blank.

Now, it is assumed that the mask factory 112 is in receipt of mask blank information 141 from the mask blank factory 111 and is going to write a mask pattern 142. The mask blank information 141 includes first-film film information, second-film film information, and resist-film film information.

Generally, as shown in FIG. 22, a mask pattern formed on a mask has a dense pattern region 143 where the density of a pattern is high and a sparse pattern region 144 where the density of a pattern is low.

As the mask having the region 143 where a dense pattern is formed as a mask pattern and the region 144 where a sparse pattern is formed, there is cited a system LSI manufacturing mask or the like.

Particularly, the mask fabrication supporting method of this invention is particularly effective to the case of a pattern having, as a sparse pattern forming region, a monitor chip forming region formed for testing electrical properties.

On the other hand, generally, defects of a mask blank that may cause pattern failure in the mask manufacturing process, specifically, pinholes and particles, are often not uniformly distributed but unevenly distributed.

Referring to the received film information 141 being the mask blank information, the pattern writing position is determined through adjustment so that pinholes and particles which may cause pattern failure are located in the region other than the dense pattern forming region 143 in the mask pattern data (step S123).

As a pattern writing position adjusting method, it is considered to change the direction of the mask pattern 142 with respect to the direction of the mask blank. On the other hand, if it is possible to change the relative position relationship between the dense pattern forming region 143 and the sparse pattern forming region 144, the adjustment may be carried out by changing it.

Finally, in accordance with the determined pattern writing position, a pattern is written on the resist film and developed, thereby obtaining a mask formed with a mask pattern (transfer pattern) on the glass substrate (step S124).

In the mask fabricated through the foregoing steps S121 to S124, pinholes and particles in the mask blank that may cause pattern failure are located in the sparse pattern forming region and hence it is possible to suppress pattern formation failure of the mask pattern.

Next, referring to FIG. 23, description will be made in detail about one example of a mask blank production line control system 50 wherein the host computer 51 collects information of the respective processes (e.g. substrate information and film information produced in the respective inspection processes and information such as manufacturing conditions and recipes) from the respective apparatuses in the foregoing embodiment.

Figure 23:
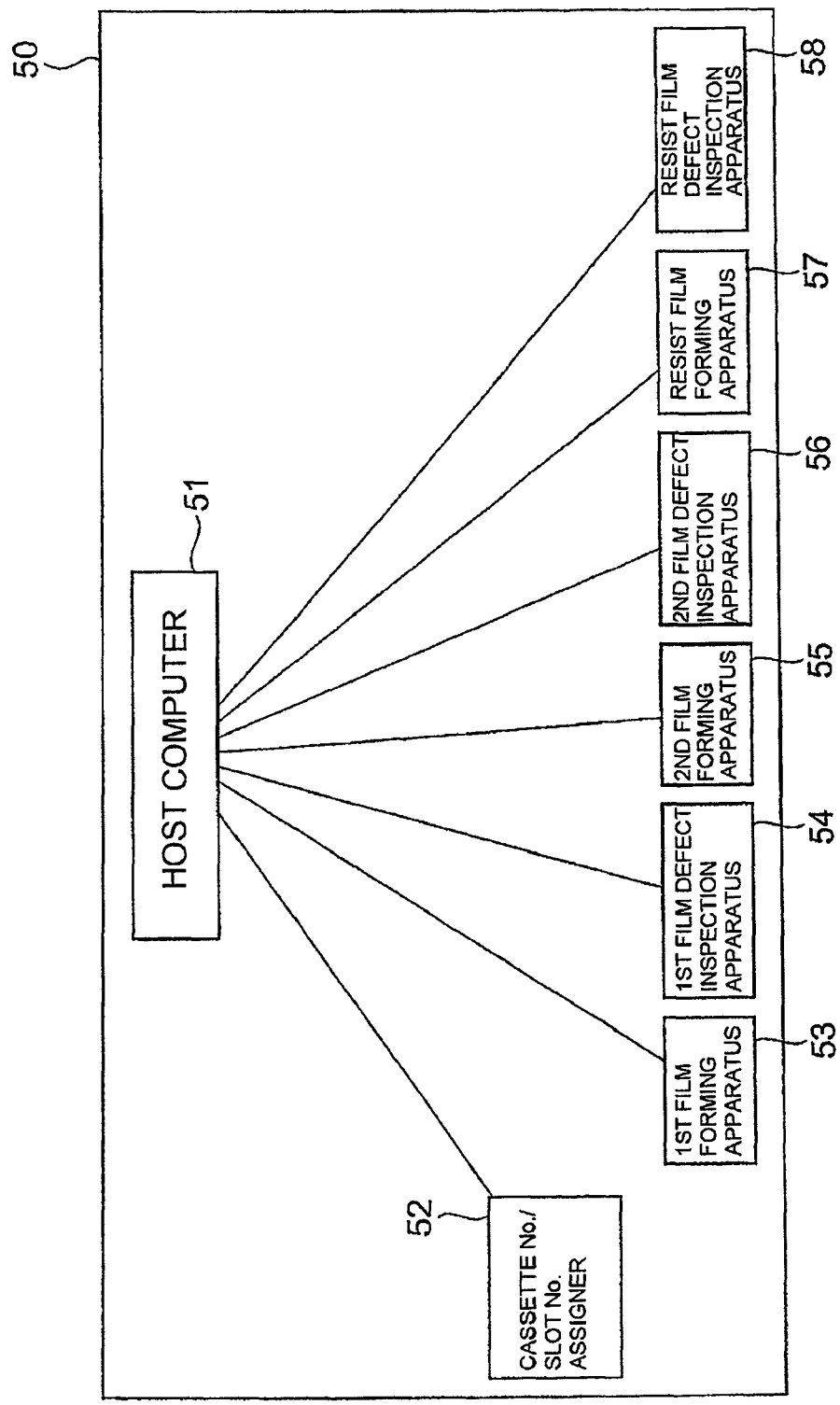
FIG. 23 is a block diagram for explaining a mask blank film information management system 50 of this invention.

Referring to FIG. 23, the mask blank production control system 50 comprises a host computer 51, a cassette number/slot number assigner 52 (hereinafter referred to as the assigner 52), a first film forming apparatus 53, a first film defect inspection apparatus 54, a second film forming apparatus 55, a second film defect inspection apparatus 56, a resist film forming apparatus 57, and a resist film defect inspection apparatus 58.

A distribution cassette has a plurality of grooves formed at predetermined intervals and extending from upper to lower so as to receive a plurality of substrates therein and is provided with an ID tag. The ID tag is assigned information adapted to manage the respective substrates placed in the distribution cassette. Specifically, a cassette number of the distribution cassette is recorded.

Referring to FIG. 24, when putting substrates on the production line, the substrates are placed in respective grooves of a distribution cassette and a cassette number, slot numbers, and a process flow are input into an ID tag from an input section 521 in the assigner 52.

The process flow includes a process order, a name of an apparatus for use in the process, and a recipe number corresponding to process conditions of a process to be performed in the apparatus and is given per distribution cassette according to mask blanks to be manufactured. On the production line, the substrate can be identified by the position in the processes, the cassette number, and the slot number.

The assigner 52 writes the cassette number in an ID tag of the distribution cassette and, by the use of a data transmission/reception section 522, transmits the cassette number, the slot numbers, and the process flow to the host computer 51. Referring to FIG. 25, after reception at a data transmission/reception section 511 of the data transmitted from the assigner 52, the host computer 51 stores the cassette number, the slot numbers, and the process flow in a process flow storage section 512 while correlating them with each other.

When the distribution cassette finished with the input of the cassette number by the assigner 52 (hereinafter, this distribution cassette will be referred to as the cassette A) is set in a loader port 531 of the first film forming apparatus 53, the first film forming apparatus 53 reads the cassette number from the ID tag of the cassette A and notifies it to the host computer 51 by the use of a data transmission/reception section 532.

Figure 26:
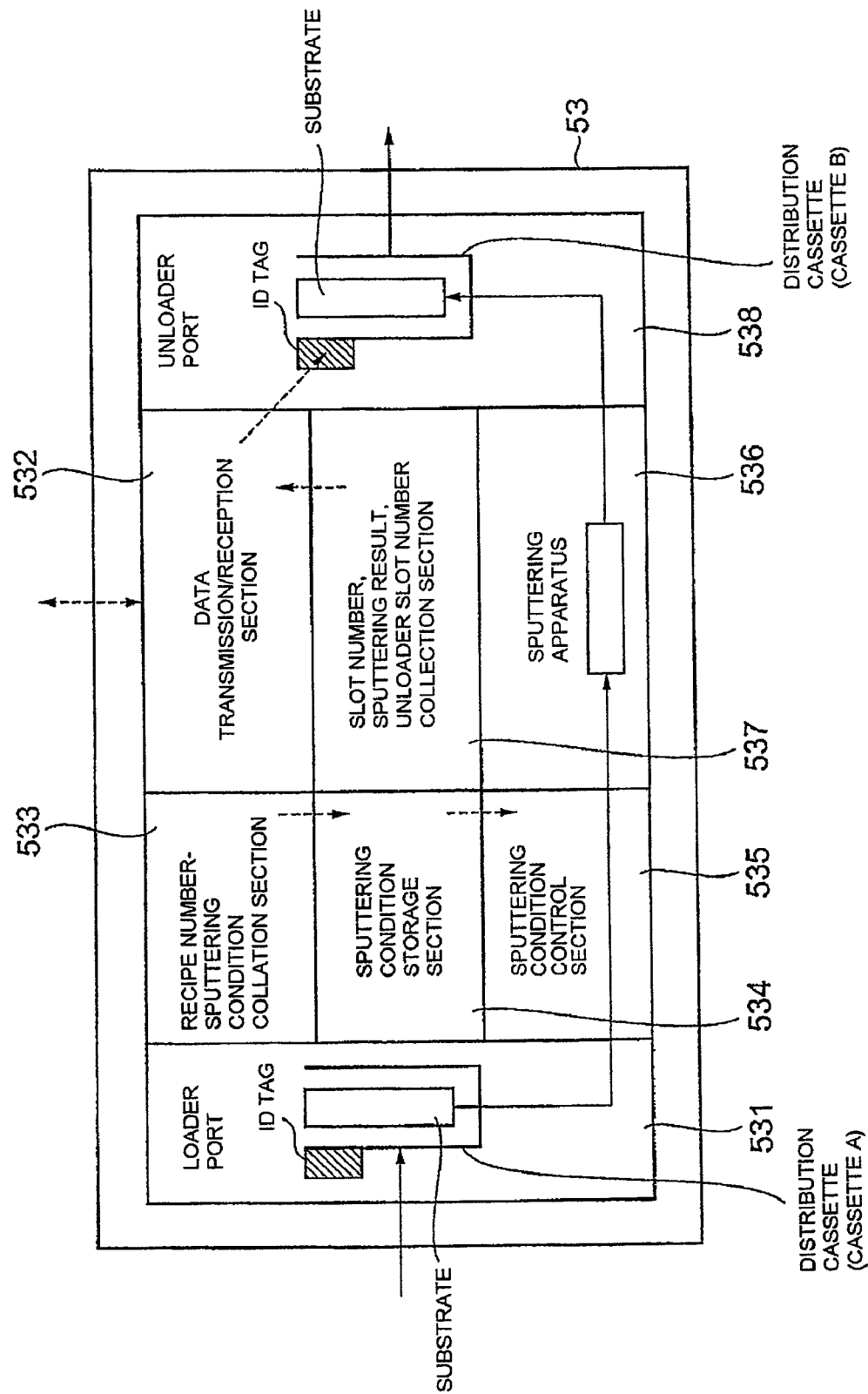
FIG. 26 is a block diagram for explaining a first film forming apparatus 53.

Referring to FIG. 26, the host computer 51, in response thereto, transmits the cassette number of the cassette A, the slot numbers, and the recipe number of sputtering film formation to the first film forming apparatus 53. With respect to the recipe number, its transmission may be immediately before the start of operation of the sputtering film formation.

In the first film forming apparatus 53 in receipt thereof, a recipe number-sputtering condition collation section 533 identifies a sputtering condition corresponding to the recipe number and stores the identified sputtering condition in a sputtering condition storage section 534. According to this sputtering condition, a sputtering condition control section 535 controls a sputtering apparatus 536 to carry out the sputtering film formation.

The sputtering apparatus 536 takes the substrate from the cassette A and starts the sputtering film formation. During the sputtering film formation, the sputtering results are collected and correlated with the slot number.

The substrate finished with the sputtering film formation enters a slot of another distribution cassette (hereinafter referred to as the cassette B) prepared in advance in an unloader port 538. In this event, a slot number, sputtering result, unloader slot number collection section 537 (hereinafter referred to as the collection section 537) collects the slot number in the cassette A, the correlated sputtering results, and a slot number in the cassette B and transmits them to the host computer 51 by the use of the data transmission/reception section 532. When slots of the cassette B are all occupied by the substrates having been subjected to the first film formation, the collection section 537 notifies the host computer 51 to that effect as well as of a cassette number of the cassette B.

In response thereto, the host computer 51 specifies the next process in terms of the cassette number B, the cassette number A, and the process flow and notifies a transfer destination to a non-illustrated cassette transfer portion. Further, the host computer 51 transmits the cassette number of the cassette B and the recipe number of sputtering transmitted to the first film forming apparatus 53, to the first film defect inspection apparatus 54.

Figure 27:
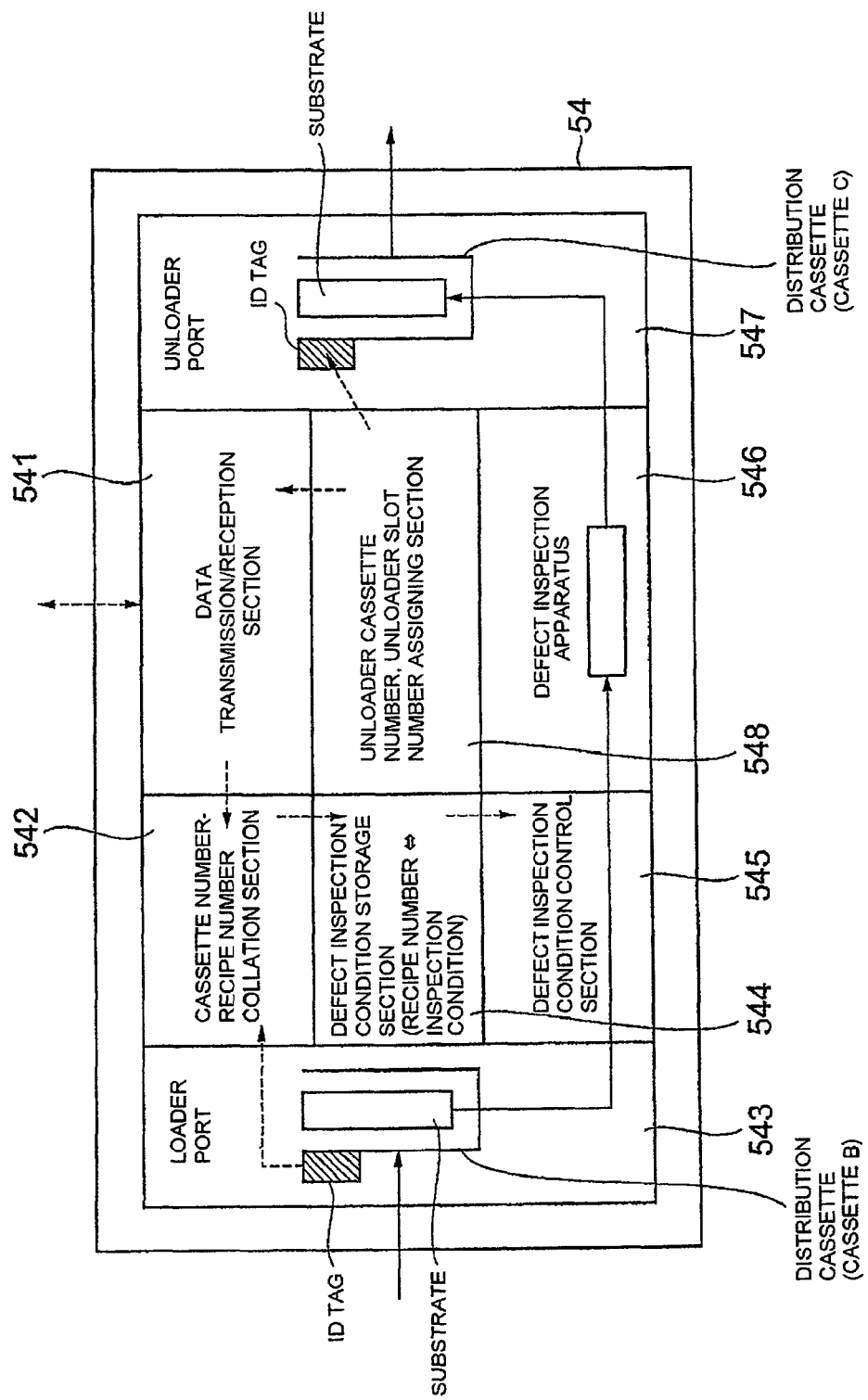
FIG. 27 is a block diagram for explaining a first film defect inspection apparatus 54.

Referring to FIG. 27, in response to receipt of them at a data transmission/reception section 541, the first film defect inspection apparatus 54 gives them to a cassette number-recipe number collation section 542.

When the distribution cassette is carried into a loader port 543, the cassette number-recipe number collation section 542 identifies a recipe number corresponding to the cassette number read from an ID tag of the distribution cassette. Herein, if the cassette number is that of the cassette B, there is obtained the recipe number that was used when the sputtering film formation was applied to the substrates placed in the cassette B.

In a defect inspection condition storage section 544, there is stored in advance a correlation between recipe numbers and inspection conditions to be carried out for films formed under recipe conditions indicated by the recipe numbers. In response to receipt of the recipe number from the cassette number-recipe number collation section 542, the defect inspection condition storage section 544 outputs the inspection condition to be carried out.

According to this inspection condition, a defect inspection condition control section 545 controls a defect inspection apparatus 546 to carry out an inspection. The defect inspection apparatus 546 outputs an inspection result as defect inspection information. The inspected substrate is placed in a slot of another distribution cassette (hereinafter referred to as the cassette C) set in advance in an unloader port 547.

An unloader cassette number, unloader slot number assigning portion 548 assigns a cassette number to the cassette C and, by the use of the data transmission/reception section 541, transmits the cassette number of the cassette C, slot numbers of the cassette C, and the defect inspection information of the substrates placed in the slots to the host computer 51 while correlating them with each other.

The host computer 51 stores the transmitted information in an information storage section 513 while correlating it with the sputtering results and so on obtained in the first film forming apparatus 53.

Figure 28:
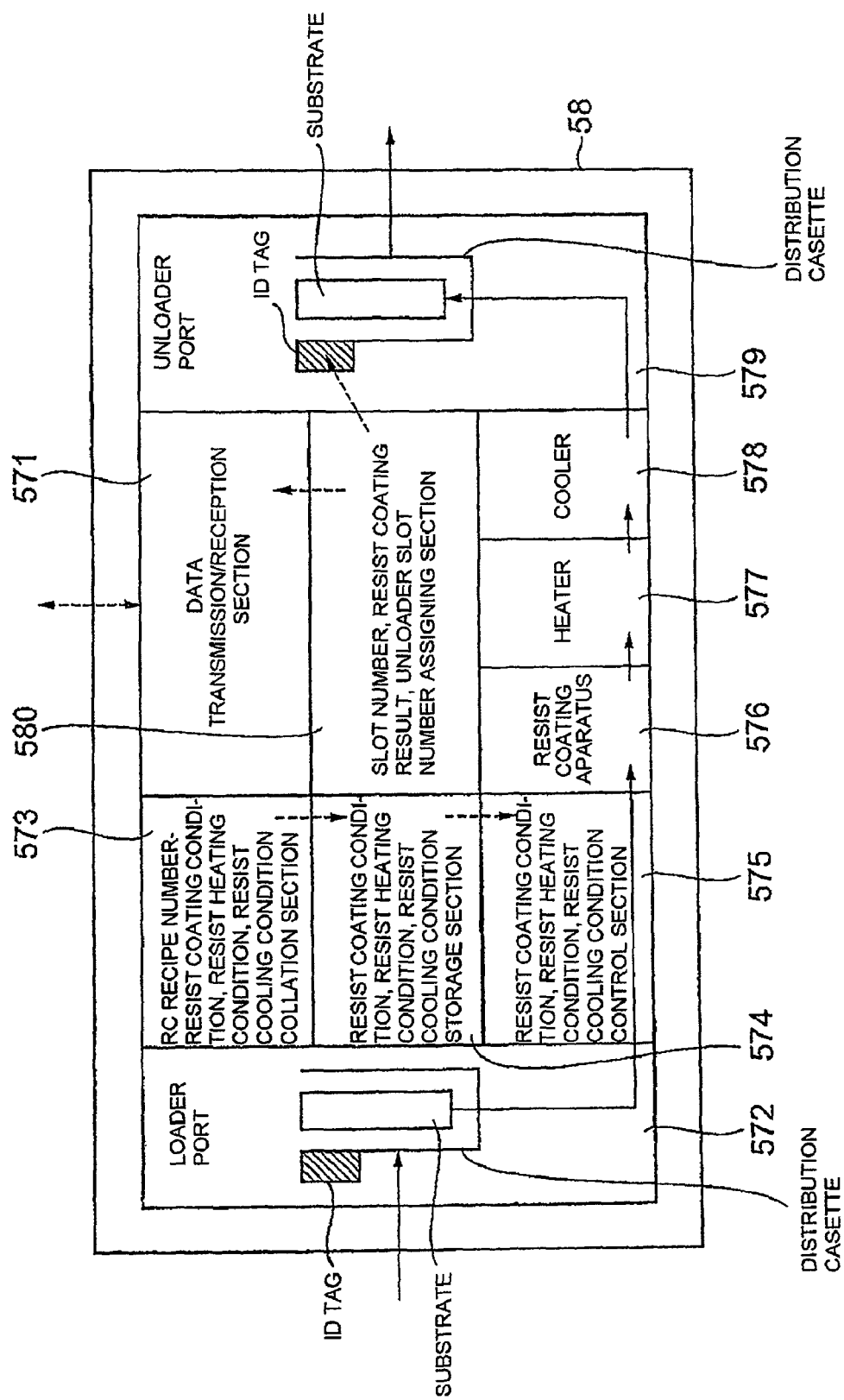
FIG. 28 is a block diagram for explaining a resist film forming apparatus 57.

With respect to the second film forming apparatus 55 and the second film inspection apparatus 56, explanation thereof is omitted because, as compared with the first film forming apparatus 53 and the first film inspection apparatus 54, respectively, there is a difference only due to difference in kind of a film to be formed, but no large difference in components and operation. This also applies to the resist film forming apparatus 57 and the resist film defect inspection apparatus 58 shown in FIG. 28.

Based on the information collected from the first film forming apparatus 53, the first film inspection apparatus 54, the second film forming apparatus 55, the second film inspection apparatus 56, the resist film forming apparatus 57, and the resist film inspection apparatus 58 as described above, a defect information collation section 514 produces the first-film film information, the second-film film information, and the resist-film film information described in the first embodiment and collates them with each other to produce the mask blank information shown in FIG. 17.

In the foregoing embodiments, when setting the substrate or the mask blank in the distribution cassette or the receiving case, on the substrate holder of the sputtering apparatus, or on the stage of the defect inspection apparatus, the substrate is managed to be aligned in the specific directivity (direction) on the basis of the notch mark or the film mark 3 or 6. However, not limited thereto, the directivity of the substrate can be specified only by the notch mark 1 in all the mask blank manufacturing processes and hence the directivity of the substrate may be managed only the notch mark 1.

Instead of the notch mark 1 or the film mark 3 or 6, use may be made of a reference mark given to the substrate. In this case, the reference mark may have a shape that can specify the directivity (direction) of the substrate.

The layout position of the reference mark on the substrate or the mask blank may be a position that is rotation asymmetric with respect to the center of the substrate.

In the foregoing embodiments, the film information is film information of the plurality of films formed on the substrate. However, the film information to be acquired may be that of the single film. This is applicable even to the information acquired when the mask blank is shipped from the mask blank factory. Even in this case, there is the function of ensuring the consistency between the reference point and the XY coordinate system of the film information and the reference point and the XY coordinate system of the mask blank. Information of the surface of the substrate may be included other than the film information.

In the foregoing embodiments, the mask fabrication supporting method of this invention has been described by citing, as an example of the mask blank, the halftone phase shift mask blank having the MoSiN halftone film, the Cr light shielding film, and the resist film formed on the glass substrate. However, not limited thereto, it is also applicable to a so-called photomask blank having a Cr light shielding film and a resist film formed on a glass substrate or a reflective mask blank having a multilayer reflective film, an absorbent film, and a resist film formed on a glass substrate.

Further, in the foregoing mask blank, this invention can be utilized even in the case where the resist film is not formed.

Further, this invention is not limited to the film material of the halftone film or the film material of the light shielding film described in the embodiments and use may be made of other film materials that are generally applicable to mask blanks.

In the foregoing embodiments, the ID tag is provided per distribution case. However, although the distribution case is not the case, the ID tag may be used by reattaching it to a distribution case for use in the next process.

While this invention has been described in terms of the embodiments, this invention is not limited thereto and changes and improvements thereof are of course possible within the general knowledge of a person skilled in the art.

For example, in the foregoing embodiments, the film information includes X and Y coordinates of the XY coordinate system determined in advance on the film on the basis of the predetermined direction of the substrate, the size of each defect, and the type of each defect. However, the kinds of measurement values and the number thereof at the respective coordinates are not limited thereto. It is considered that values relating to the shape such as flatness, electrical property values such as electrical resistance value, optical property values such as refractive index, and so on are included as film information. Among these measurement values, all or part of them may be included in the film information.

In the substrate information and various film information, the orthogonal coordinate system is used as a coordinate system. However, not limited thereto, it may be a polar coordinate system instead or a three-dimensional coordinate system may be used instead of the two-dimensional coordinate system. For example, assuming that the XYZ coordinate system is used for film information, it is possible to include such information that a hole is present at a position of depth Z at a point given by X and Y on the surface of a film, and hence, it becomes possible to acquire more detailed mask blank information.

The invention claimed is:

1. A transfer mask manufacturing method comprising:
preparing a mask blank comprising a substrate, a first film formed on a surface of the substrate; and a second film formed on the first film;
determining, based on mask blank information, a region where a mask pattern is to be arranged on the mask blank, the mask blank information including first film information and second film information and being produced by collating the first film information and the second film information with each other, is the first film being acquired after the first film is formed and before the second film is formed, and the second film information being acquired after the second film is formed, each of the first film information and the second film information comprising at least one of information of the position of a defect, the size of the defect, and the type of the defect; and
patterning the mask blank with reference to the determined region to form the mask pattern.

2. The method claimed in claim 1, wherein the collation is made on the basis of a shape that is reflected on both the first and second film information.

3. The method according to claim 1, wherein the mask blank information is correlated with a management number or a management symbol for identifying the mask blank.

4. The method according to claim 1, wherein the mask blank information is obtained through a communication line.

5. The method according to claim 1, wherein the state information comprises at least one of surface form information and optical property information.

6. The method according to claim 1, wherein the state information comprises at least two kinds of measurement values.

7. The method according to claim 1, wherein at least one of the first and the second films is a phase shift film.

8. The method according to claim 1, wherein at least one of the first and the second films is a light shielding film.

9. The method according to claim 1, wherein the second film is a resist film.

10. The method according to claim 1, wherein the mask pattern formed on the mask blank comprises a relatively dense pattern block and a relatively sparse pattern block.

* * * * *